(12) United States Patent
Xie et al.

(10) Patent No.: US 12,527,068 B2
(45) Date of Patent: Jan. 13, 2026

(54) TWO-DIMENSIONAL SELF-ALIGNED BACKSIDE VIA-TO-BACKSIDE POWER RAIL (VBPR)

(71) Applicant: International Business Machines Corporation, Armonk, NY (US)

(72) Inventors: Ruilong Xie, Niskayuna, NY (US);
Kisik Choi, Watervliet, NY (US);
Brent A Anderson, Jericho, VT (US);
Lawrence A. Clevenger, Saratoga Springs, NY (US); John Christopher Arnold, North Chatham, NY (US)

(73) Assignee: International Business Machines Corporation, Armonk, NY (US)

( * ) Notice: Subject to any disclaimer, the term of this patent is extended or adjusted under 35 U.S.C. 154(b) by 761 days.

(21) Appl. No.: 17/565,661

(22) Filed: Dec. 30, 2021

(65) Prior Publication Data
US 2023/0215767 A1  Jul. 6, 2023

(51) Int. Cl.
*H10D 84/03* (2025.01)
*H01L 21/768* (2006.01)
(Continued)

(52) U.S. Cl.
CPC ..... *H10D 84/038* (2025.01); *H01L 21/76895* (2013.01); *H01L 23/481* (2013.01);
(Continued)

(58) Field of Classification Search
CPC .................. H01L 21/74; H01L 21/743; H01L 21/823475; H01L 21/823871;
(Continued)

(56) References Cited

U.S. PATENT DOCUMENTS

| 2010/0230729 A1 | 9/2010 | Ellis-Monaghan |
| 2019/0058052 A1 | 2/2019 | Frougier |

(Continued)

OTHER PUBLICATIONS

Baker, Jacob. CMOS Circuit Design, Layout, and Simulation, 3rd edition. ISBN 978-0-470-88132-3 (Year: 2010).*

(Continued)

*Primary Examiner* — Zandra V Smith
*Assistant Examiner* — Douglas Yap
(74) *Attorney, Agent, or Firm* — Seed Intellectual Property Law Group LLP

(57) ABSTRACT

A semiconductor structure includes a field effect transistor (FET) including a first source-drain region, a second source-drain region, a gate between the first and second source-drain regions, and a channel region under the gate and between the first and second source-drain regions. Also included are a front side wiring network, having a plurality of front side wires, on a front side of the field effect transistor; a front side conductive path electrically interconnecting one of the front side wires with the first source-drain region; a back side power rail, on a back side of the FET; and a back side contact electrically interconnecting the back side power rail with the second source-drain region. A dielectric liner and back side dielectric fill are on a back side of the gate adjacent the back side contact, and they electrically confine the back side contact in a cross-gate direction.

18 Claims, 25 Drawing Sheets

(51) Int. Cl.
  *H01L 23/48* (2006.01)
  *H01L 23/535* (2006.01)
  *H10D 30/01* (2025.01)
  *H10D 62/10* (2025.01)
  *H10D 84/01* (2025.01)
  *H10D 84/85* (2025.01)

(52) U.S. Cl.
  CPC ......... *H01L 23/535* (2013.01); *H10D 30/025* (2025.01); *H10D 62/121* (2025.01); *H10D 84/0149* (2025.01); *H10D 84/0195* (2025.01); *H10D 84/85* (2025.01)

(58) Field of Classification Search
  CPC ............ H01L 21/76897; H01L 21/768; H01L 23/481; H01L 23/5286; H01L 21/76895; H01L 23/535; H10D 64/254; H10D 84/0149; H10D 84/0186; H10D 62/118–123; H10D 30/0198; H10D 30/6735; H10D 64/017
  See application file for complete search history.

(56) References Cited

U.S. PATENT DOCUMENTS

| | | | |
|---|---|---|---|
| 2021/0134721 A1* | 5/2021 | Chiang | H01L 29/66553 |
| 2021/0225768 A1 | 7/2021 | Peng | |
| 2021/0305252 A1* | 9/2021 | Chiang | H01L 29/7851 |
| 2021/0336012 A1* | 10/2021 | Huang | H01L 29/66818 |
| 2021/0375761 A1* | 12/2021 | Chang | H01L 27/092 |
| 2021/0375861 A1* | 12/2021 | Chung | H01L 29/785 |
| 2021/0376076 A1* | 12/2021 | Su | H01L 21/76897 |
| 2022/0069076 A1* | 3/2022 | Yu | H10D 30/0213 |
| 2022/0359369 A1* | 11/2022 | Tsai | H01L 29/66439 |

OTHER PUBLICATIONS

Huang, Wanguo, National Intellectual Property Administration, PRC, as ISA, counterpart PCT appln. PCT/IB2022/060236 ISR and written opinion mailed on Jan. 18, 2023. pp. 7.

* cited by examiner

TWO-DIMENSIONAL SELF-ALIGNED BACKSIDE VIA-TO-BACKSIDE POWER RAIL (VBPR)

BACKGROUND

The present invention relates generally to the electrical, electronic and computer arts and, more particularly, to backside contact formation for backside power rails and backside power distribution networks (BSPDN).

Backside power rails (BPRs) have been proposed for improving the routability of back end of line (BEOL) interconnects by decoupling signal wirings from power supplies. Current BPR techniques are vulnerable to shorting between contacts, and may exhibit undesirably high resistance and limited capability for scaling to smaller cell height for standard logic cells.

BRIEF SUMMARY

Principles of the invention provide techniques for two-dimensional self-aligned backside vias-to-backside power rails (VBPR). In one aspect, an exemplary semiconductor structure includes a field effect transistor (FET) including a FET first source-drain region, a FET second source-drain region, a FET gate between the first and second source-drain regions, and a FET channel region under the FET gate and between the FET first and second source-drain regions. Also included are a front side wiring network, having a plurality of front side wires, on a front side of the field effect transistor (FET); a front side conductive path electrically interconnecting one of the front side wires with the FET first source-drain region; a back side power rail, on a back side of the field effect transistor (FET); a back side contact electrically interconnecting the back side power rail with the FET second source-drain region; and a dielectric liner and back side dielectric fill on a back side of the FET gate adjacent the back side contact, the dielectric liner and back side dielectric fill electrically confining the back side contact in a cross-gate direction.

In a further aspect, an exemplary semiconductor array structure includes a plurality of p-type field effect transistors (PFETs), each including a PFET source, a PFET drain, a PFET gate between the PFET source and the PFET drain, and a PFET channel region under the PFET gate and between the PFET drain and the PFET source; a plurality of n-type field effect transistors (NFETs), each including an NFET source, an NFET drain, an NFET gate between the NFET source and the NFET drain, and an NFET channel region under the NFET gate and between the NFET drain and the NFET source; and a front side wiring network, having a plurality of front side wires, on a front side of the plurality of p-type field effect transistors and the plurality of n-type field effect transistors. Also included are a plurality of first front side conductive paths electrically interconnecting first selected ones of the front side wires with the NFET drains; a plurality of second front side conductive paths electrically interconnecting second selected ones of the front side wires with the PFET sources; a plurality of drain back side power rails, disposed by a back side of the p-type field effect transistors; a plurality of source back side power rails, disposed by a back side of the n-type field effect transistors; a plurality of drain back side contacts electrically interconnecting the plurality of drain back side power rails with the drains of the p-type field effect transistors; and a plurality of source back side contacts electrically interconnecting the plurality of source back side power rails with the sources of the n-type field effect transistors. A dielectric liner and back side dielectric fill are on a back side of the PFET gate and a back side of the NFET gate respectively adjacent the drain back side contacts and the source back side contacts. The dielectric liner and back side dielectric fill electrically confining the drain back side contacts and the source back side contacts in a cross-gate direction.

In still a further aspect, an exemplary method of forming a semiconductor array structure includes providing a first precursor structure, which, in turn, includes a substrate; an inner portion of a first dielectric liner outward of the substrate; a silicon layer outward of the inner portion of the first dielectric liner; an outer portion of the first dielectric liner outward of the silicon layer; a plurality of fin stacks outward of the outer portion of the first dielectric layer, the plurality of fin stacks including alternating layers of silicon and silicon germanium with sidewall spacers thereon, the plurality of fin stacks defining a plurality of gaps therebetween; a plurality of shallow trench isolation regions located in the inner portion of the first dielectric liner, the silicon layer, and the outer portion of the first dielectric liner inward of the gaps; and a plurality of dummy gates located across and outward of the plurality of fin stacks. Further steps include recessing selected portions of the fin stacks, the outer portion of the first dielectric liner inward of the selected portions of the fin stacks, and the silicon layer inward of the selected portions of the fin stacks under the outer portion of the first dielectric liner, to create gaps for source-drain formation; forming a second dielectric in the source-drain formation gaps and epitaxially growing source-drain regions over the second dielectric to create a second precursor structure; and replacing the dummy gates with metal replacement gate structures. Even further steps include removing the substrate, down to the inner portion of the first dielectric liner; removing the inner portion of the first dielectric liner; removing the silicon layer between the second dielectric in the source-drain formation gaps to form cavities under the gates; forming a third dielectric, different than the second dielectric, into the cavities under the gates; selectively removing the second dielectric down to selected ones of the source-drain regions to create via to back side power rail openings; and forming the back side vias to back side power rails in the via to back side power rail openings.

In yet a further aspect, a hardware description language (HDL) design structure is encoded on a machine-readable data storage medium. The HDL design structure includes elements that when processed in a computer-aided design system generate a machine-executable representation of a semiconductor structure and/or semiconductor structure array, as described.

As used herein, "facilitating" an action includes performing the action, making the action easier, helping to carry the action out, or causing the action to be performed. Thus, by way of example and not limitation, instructions executing on a processor might facilitate an action carried out by semiconductor fabrication equipment, by sending appropriate data or commands to cause or aid the action to be performed. Where an actor facilitates an action by other than performing the action, the action is nevertheless performed by some entity or combination of entities.

Techniques as disclosed herein can provide substantial beneficial technical effects. Some embodiments may not have these potential advantages and these potential advantages are not necessarily required of all embodiments. By way of example only and without limitation, one or more embodiments may provide one or more of:

enabling backside contacts for BPR/BSPDN (backside power rails/backside power distribution network) and stacked field effect transistors (FETs);

reduce or eliminate VBPR-to-gate short;

reduce or eliminate VBPR-to-nearby epitaxy short.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of inventions described herein will be in the context of illustrative embodiments. Moreover, it will become apparent to those skilled in the art given the teachings herein that numerous modifications can be made to the embodiments shown that are within the scope of the claims. That is, no limitations with respect to the embodiments shown and described herein are intended or should be inferred.

One or more embodiments advantageously provide fully aligned backside contact formation over the source/drain (S/D) region of a transistor. The backside contact (or backside via) establishes the connection between the S/D region of the transistor and the backside power rail (BPR), and is referred as via-to-backside power rail (VBPR) in this illustration. One or more embodiments advantageously provide backside VBPRs to obtain full performance and scaling benefits for BPR/BSPDN technology. Indeed, one or more embodiments provide a low-cost, bulk solution, and/or a two-dimensionally self-aligned VBPR technique to form contacts from the back side without shorting to the gate or neighboring S/D regions from other devices.

Figure 1:
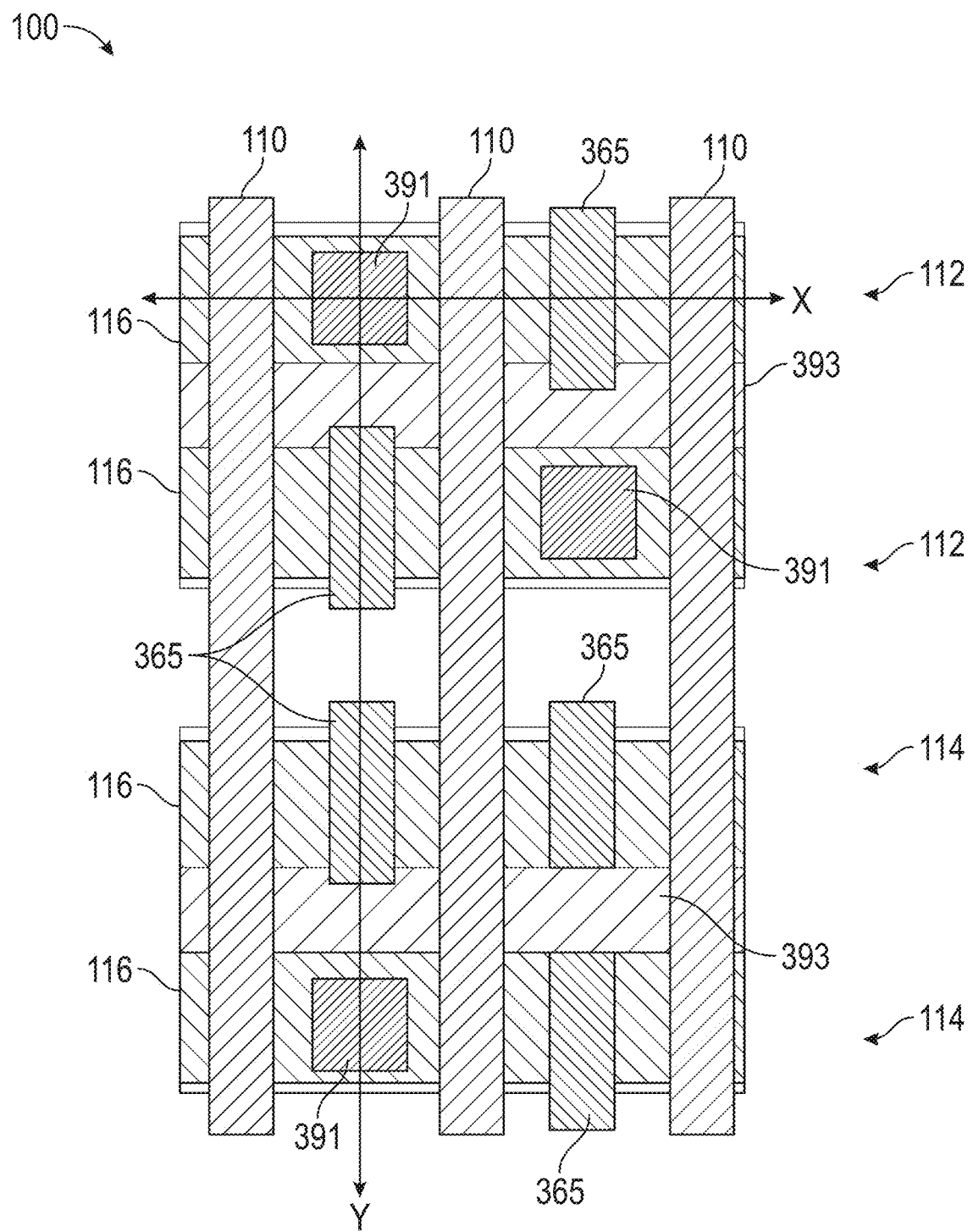
FIG. 1 is a top view of a semiconductor array structure, according to an aspect of the invention.
Figure 2:
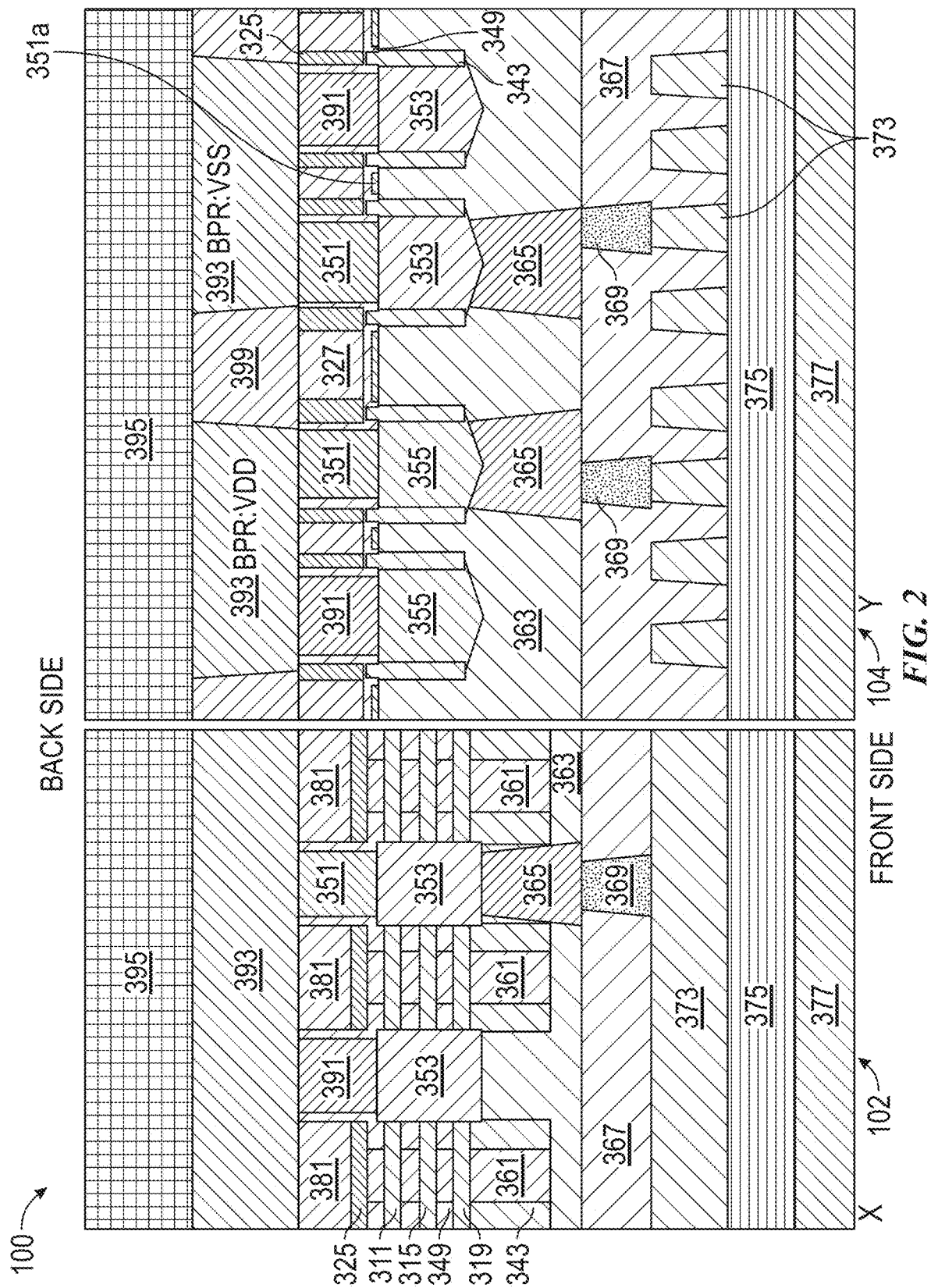
FIG. 2 presents cross-section views of the semiconductor array structure of FIG. 1, along lines X and Y thereof, according to an aspect of the invention.

Referring now to FIGS. 1 and 2, an exemplary semiconductor structure 100 is depicted. FIG. 1 is a top plan view while in FIG. 2 and subsequent figures, view 102 is a cross-section along line X in FIG. 1 and view 104 is a cross section along line Y in FIG. 1. Note that gates 110 (which include high-k metal gates 361) are formed over the active fins or nanosheets (active regions 116). Note p-type field effect transistors (PFETs) 114 (including p-type S/D regions 355) and n-type field effect transistors (NFETs) 112 (including n-type S/D regions 353).

Structure 100 includes a two-dimensional self-aligned backside contact (i.e., VBPR 391) landing over source/drain (S/D) epitaxy 353, 355. In a non-limiting example, the VBPR includes a silicide liner, such as Ni, Ti, NiPt, etc.; a thin metal adhesion layer, such as TiN or TaN; and conductive metal fill, such as Ru, W, Co, or Cu. Similar materials can be used for the other contacts, vias, power lines, etc. In some instances, there is a first dielectric liner 325, and backside dielectric fill material 381, under the gates 361, which confines the two-dimensional self-aligned backside contact 391 along the cross-gate (X) direction. In some cases, the two-dimensional self-aligned backside contact 391, along the S/D (Y or cross-fin) direction, is confined by shallow trench isolation (STI) liner 349 (also referred to as inner spacer liner 349) and STI material 327. Suitable materials for STI liners herein include, e.g., SiCO, SiOCN and silicon nitride (SiN). Suitable materials for STI herein include, e.g., silicon oxide (SiO); STI can be deposited, for example, via High Density Plasma (HDP) deposition, Chemical Vapor Deposition (CVD), etc. In some cases, there is a second dielectric 351 under (i.e., towards the back side which is at the top of FIG. 2) the S/D epitaxy 353, 355 in locations where there is no backside contact. The backside power rail 393 lands over the two-dimensional self-aligned backside contact 391, and the second dielectric 351 separates the BPR 393 from the S/D epitaxy 353, 355.

Note also middle-of-line (MOL) S/D contacts CA 365; BSPDN 395; backside inter-layer dielectric (BILD) 399; semiconductor channel layers 311, 315, 319; spacers 343 (suitable known low-K dielectric material); ILD 363; BEOL ILD 367, first BEOL vias VA 369; first BEOL metal layer (M1) 373; additional BEOL wiring layers 375; and carrier wafer 377. ILD 363, 367, 399 can be realized using $SiO_2$ or other suitable materials. Note also the thin (up to 10 nm) layer 351A of second dielectric layer material 351 between the epitaxial regions 353, 355 (best seen in FIG. 13 below).

For clarity, note that each source/drain region shown in view 104 of FIG. 2 corresponds to a different device running in the perpendicular direction (into and out of the page), as seen in the top view of FIG. 1. In the view 102 of FIG. 2, note a given transistor's Source-Gate-Drain.

Figure 3:
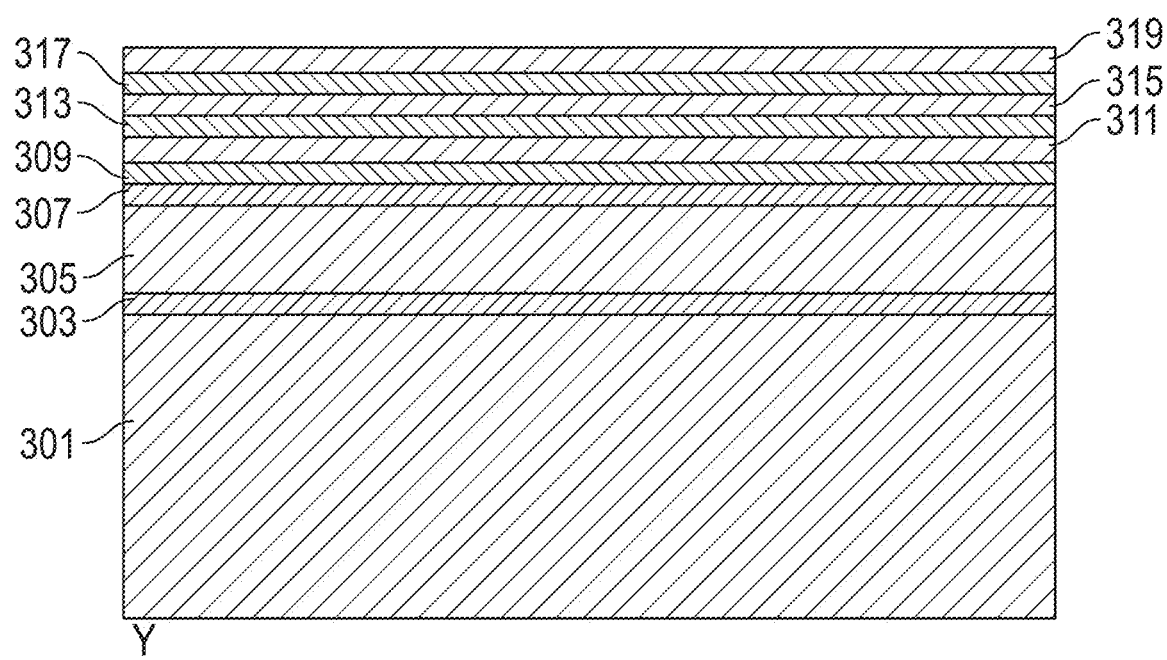
FIGS. 3-23 show exemplary steps for manufacturing the array structure of FIGS. 1-3, according to aspects of the invention.

Consider now an exemplary process flow, according to an aspect of the invention. Referring to FIG. 3, a starting structure includes a substrate, such as silicon substrate 301, with SiGe55 (SiGe with 55% Ge) layer 303 outward of substrate 301, Si layer 305 outward of layer 303, SiGe55 layer 307 outward of Si layer 305, and alternating layers of SiGe 309, 313, 317 (with a lower percentage of Ge than the SiGe55) and Si 311, 315, 319 outward of layer 307. The percentage of Ge for layers 303, 307 is exemplary. In general, layers 303, 307 can include SiGe with the Ge % ranging from 40-75% while layers 309, 313, and 317 can include SiGe with the Ge % ranging from 15-35%.

Figure 4:
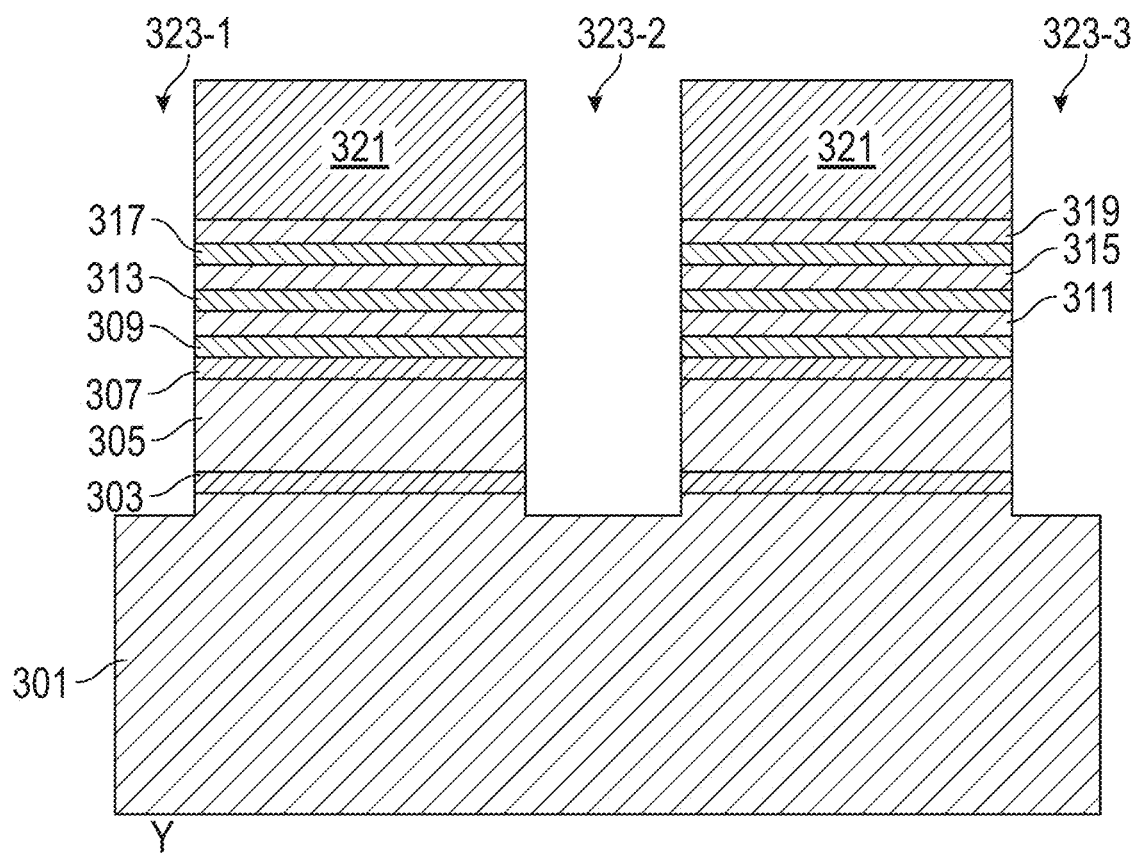
Figure 5:
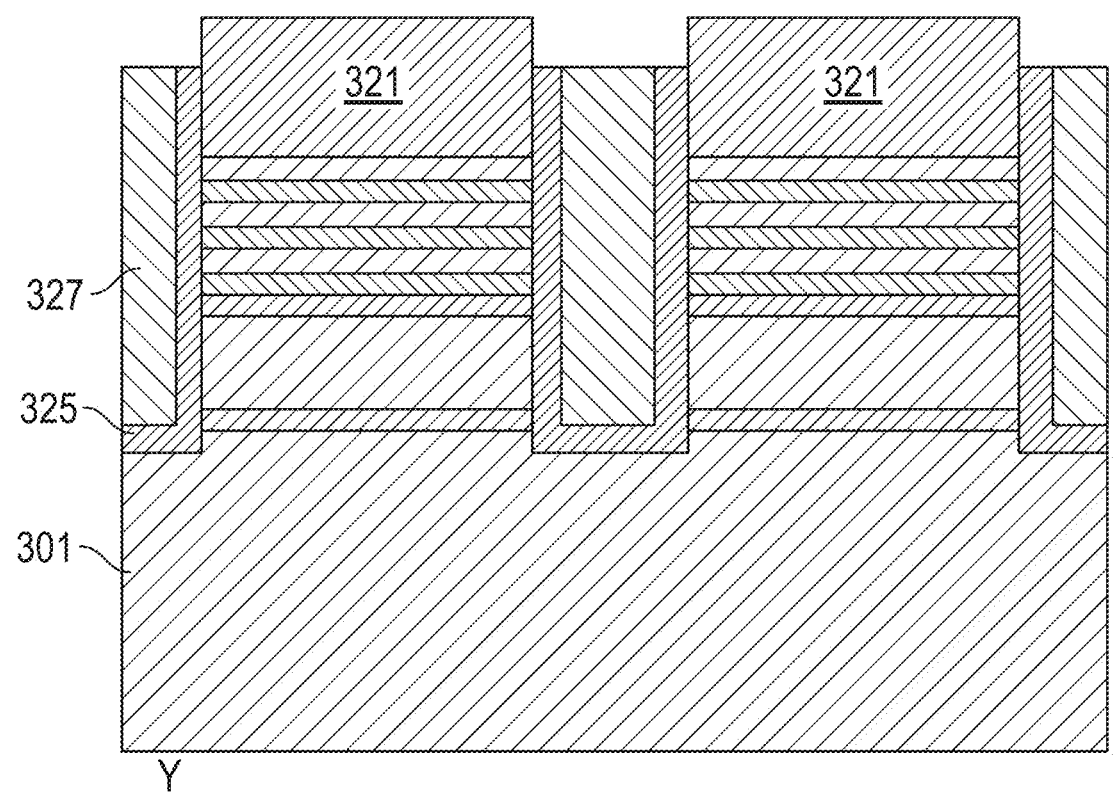

Referring to FIG. 4, deposit hard mask 321 (hard masks employed herein can include, for example, a layer or multi layers of dielectrics) and carry out first NS (nanosheet stack) patterning to obtain the depicted structure including gaps 323-1, 323-2, 323-3. In FIG. 5, deposit a first dielectric liner (e.g., SiN, SiOC, SiONC) 325, on the surfaces of the gaps 323-1, 323-2, 323-3 and then fill the gaps with STI dielectric 327 (such as oxide). After that, the dielectric fill 327 and dielectric liner 325 are recessed such that top surface of the HM 321 is exposed.

Figure 6:
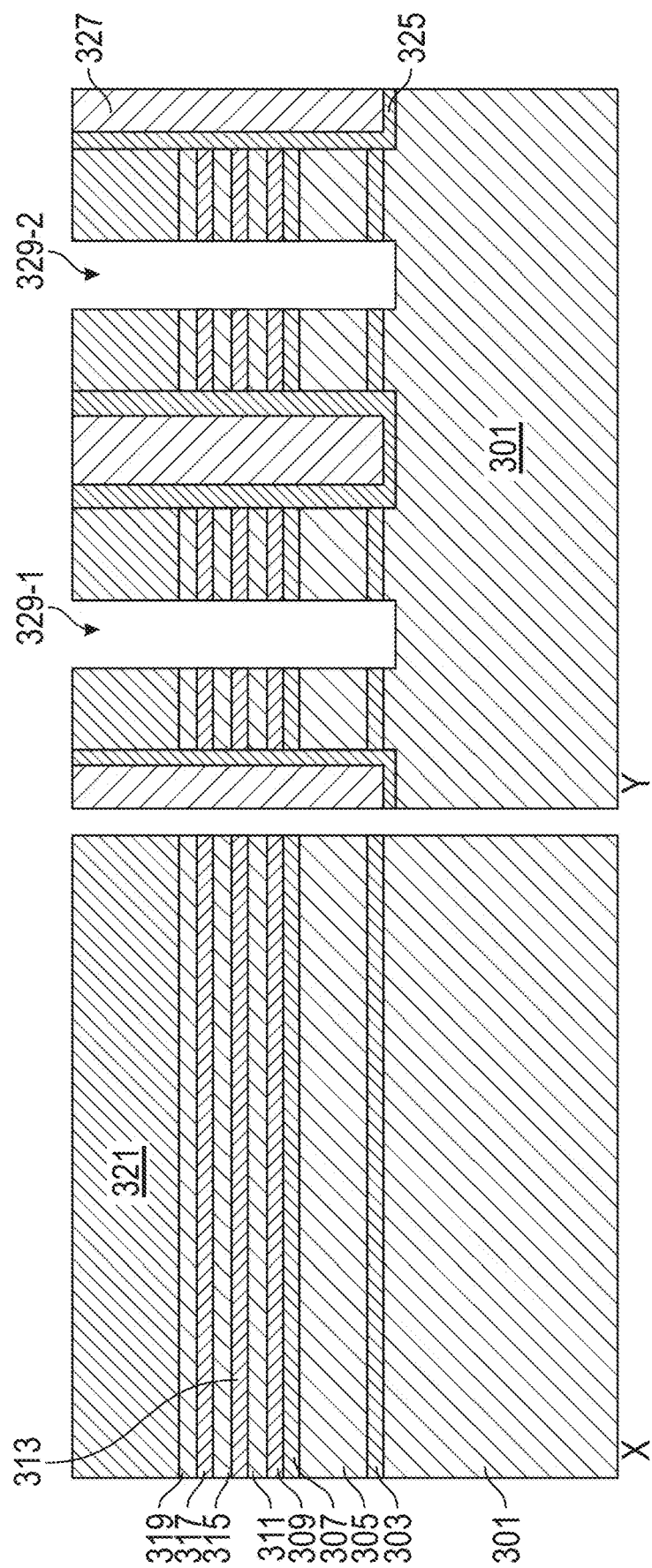
Figure 7:
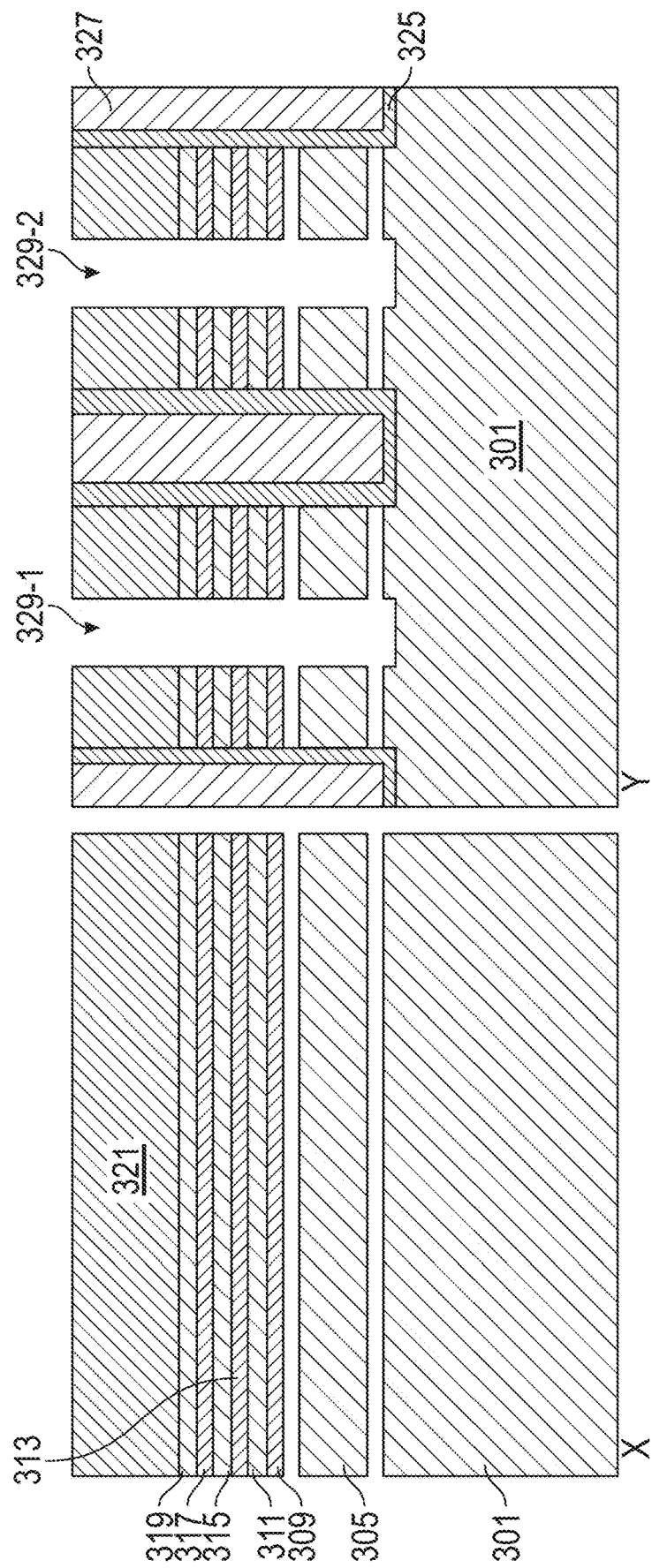
Figure 8:
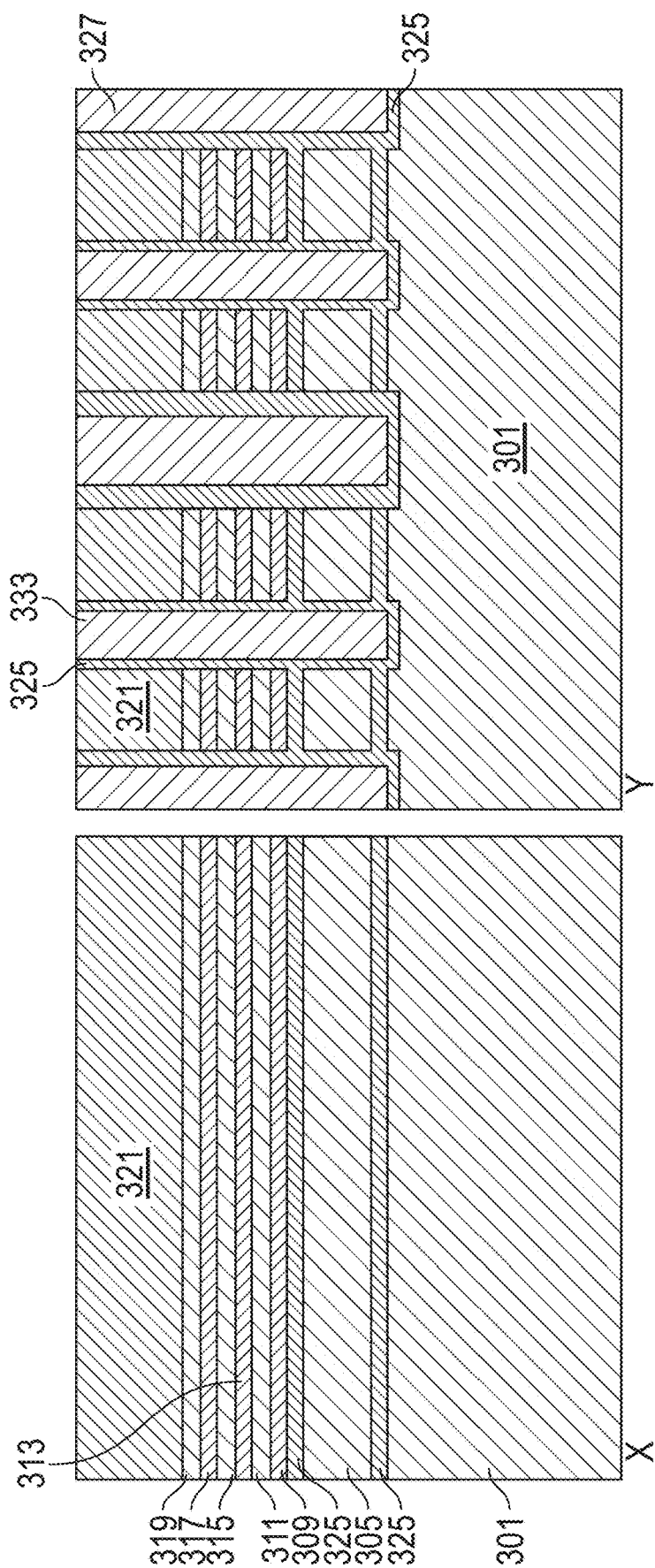

Referring to FIG. 6, carry out second NS patterning to obtain the depicted structure including gaps 329-1, 329-2. In FIG. 7, remove the SiGe55 303, 307. For example, carry out selective removal of SiGe55 303, 307 selective to SiGe sheets 309, 313, 317, Si 301, 305, 311, 315, 319, hard mask 321, and liner 325. For example, use a gas phase HCl process for this aspect. At this stage, there are no gates yet; also, the structure is not floating—all the nanosheets are attached to the STI liner 325 and STI dielectric 327, so they are stable. In FIG. 8, deposit additional first dielectric liner (e.g., SiN) 325, on the surfaces of the gaps 329-1, 329-2 and in the regions formerly occupied by the SiGe55, fill the gaps with STI dielectric 333 (such as oxide) and carry out chemical-mechanical polishing (CMP) or a similar planarization process.

Figure 9:
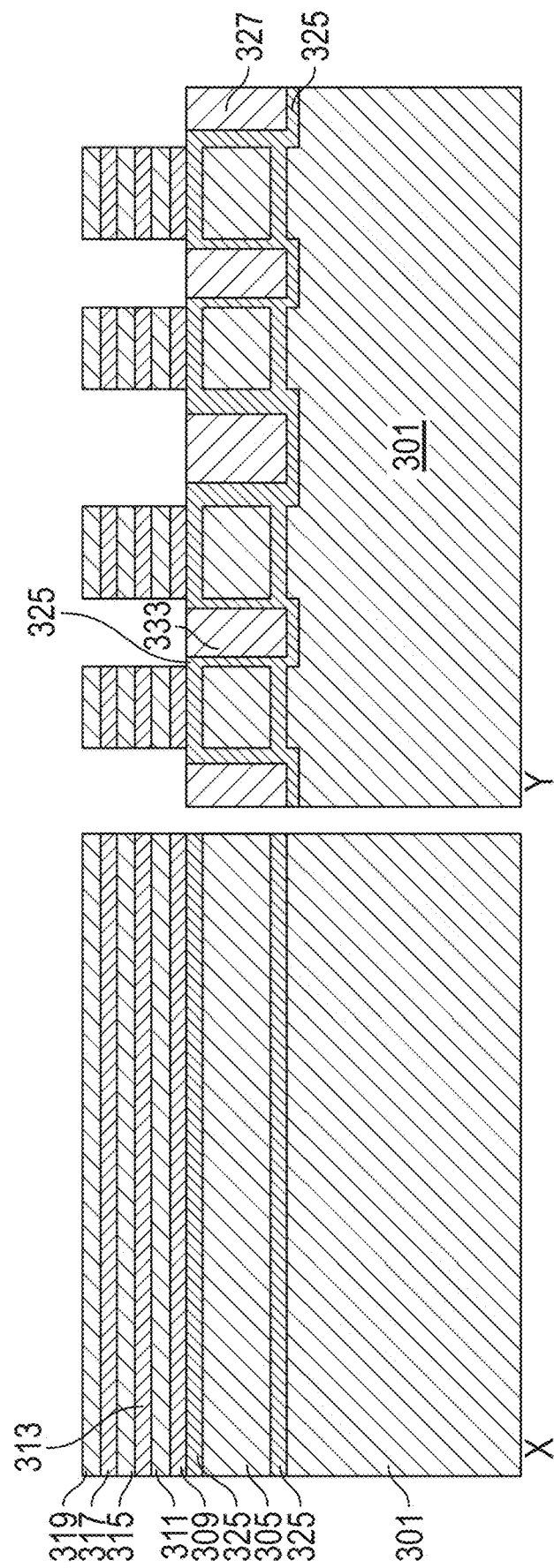
Figure 10:
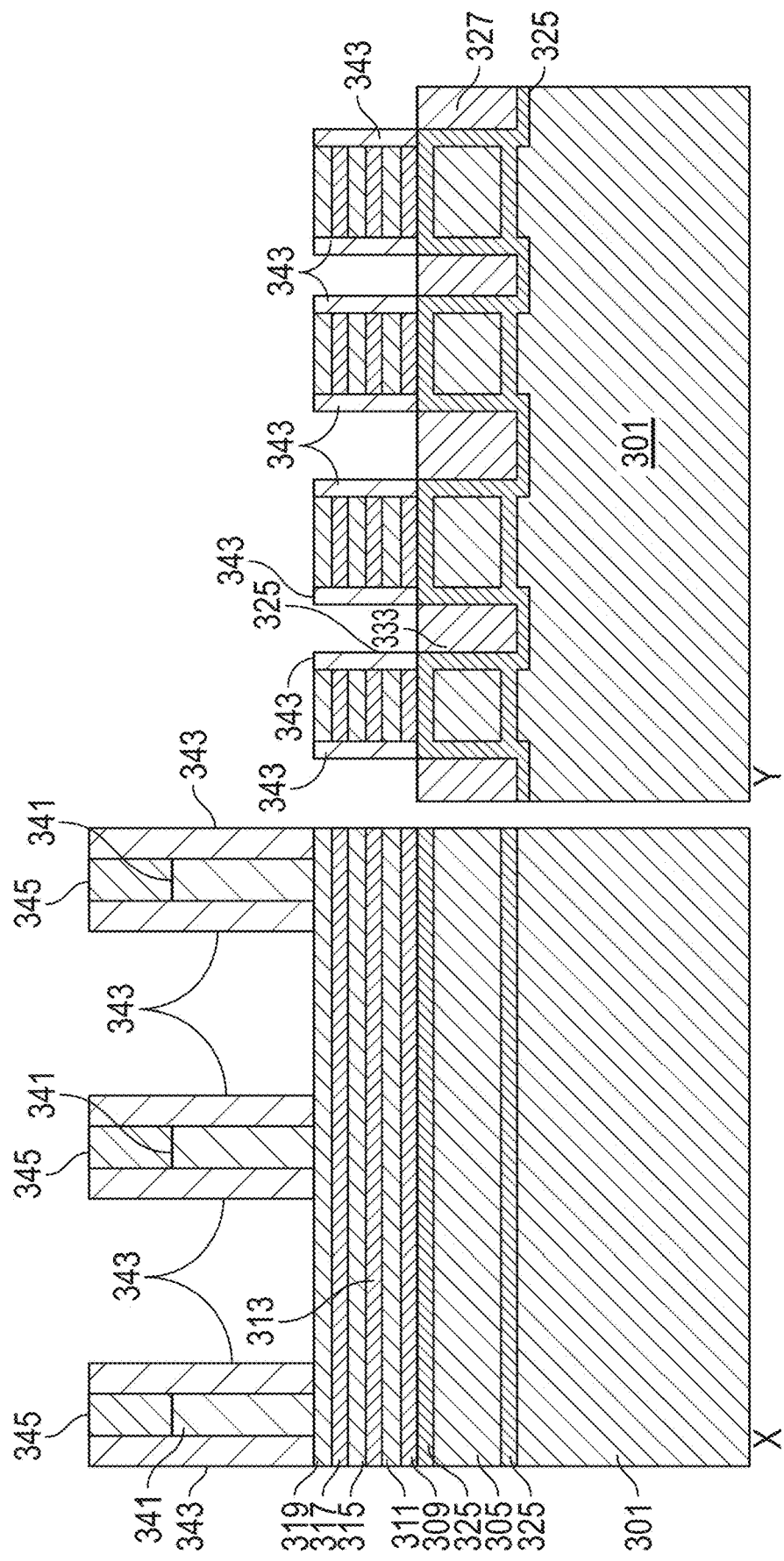
Figure 11:
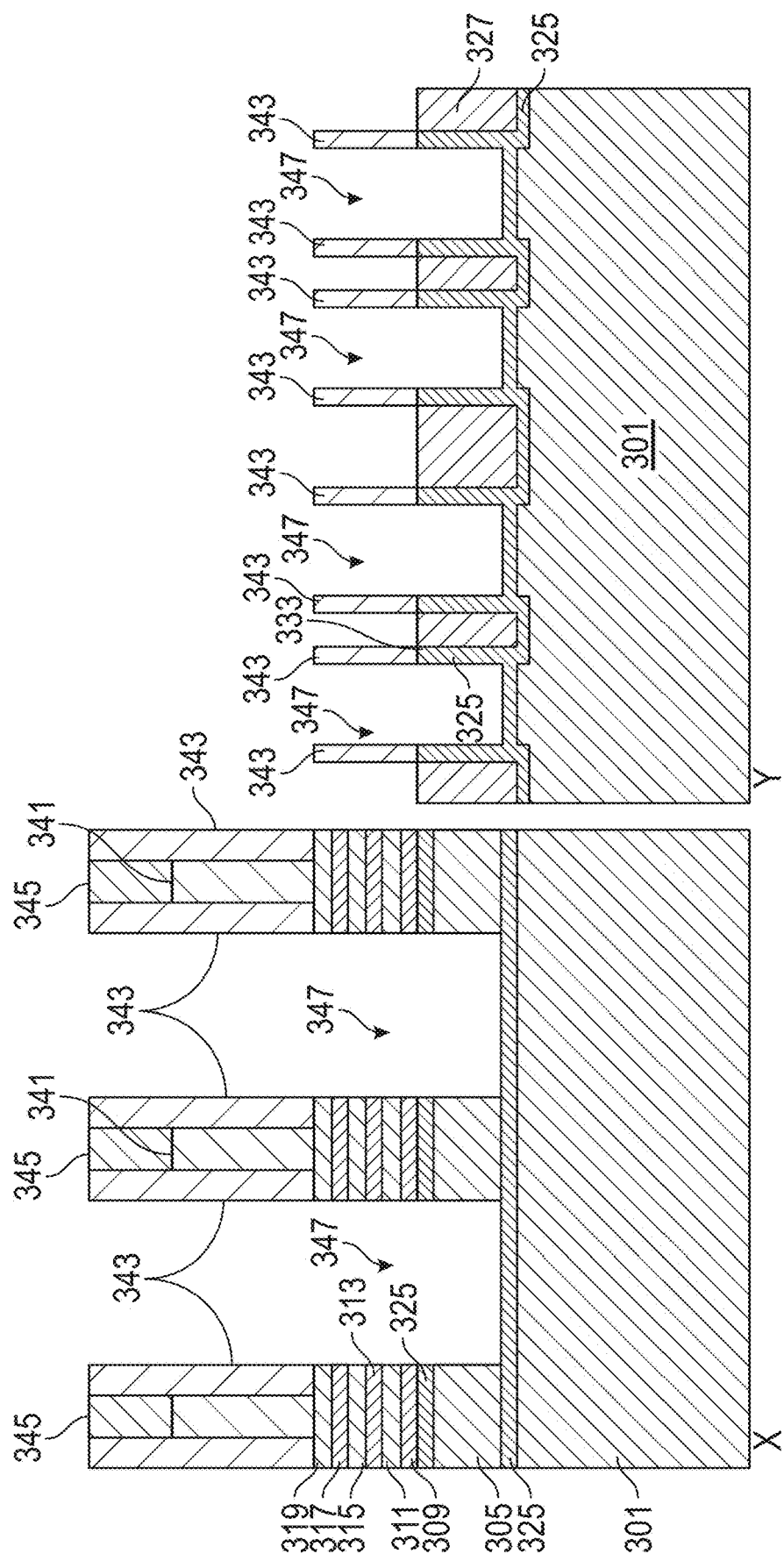
Figure 12:
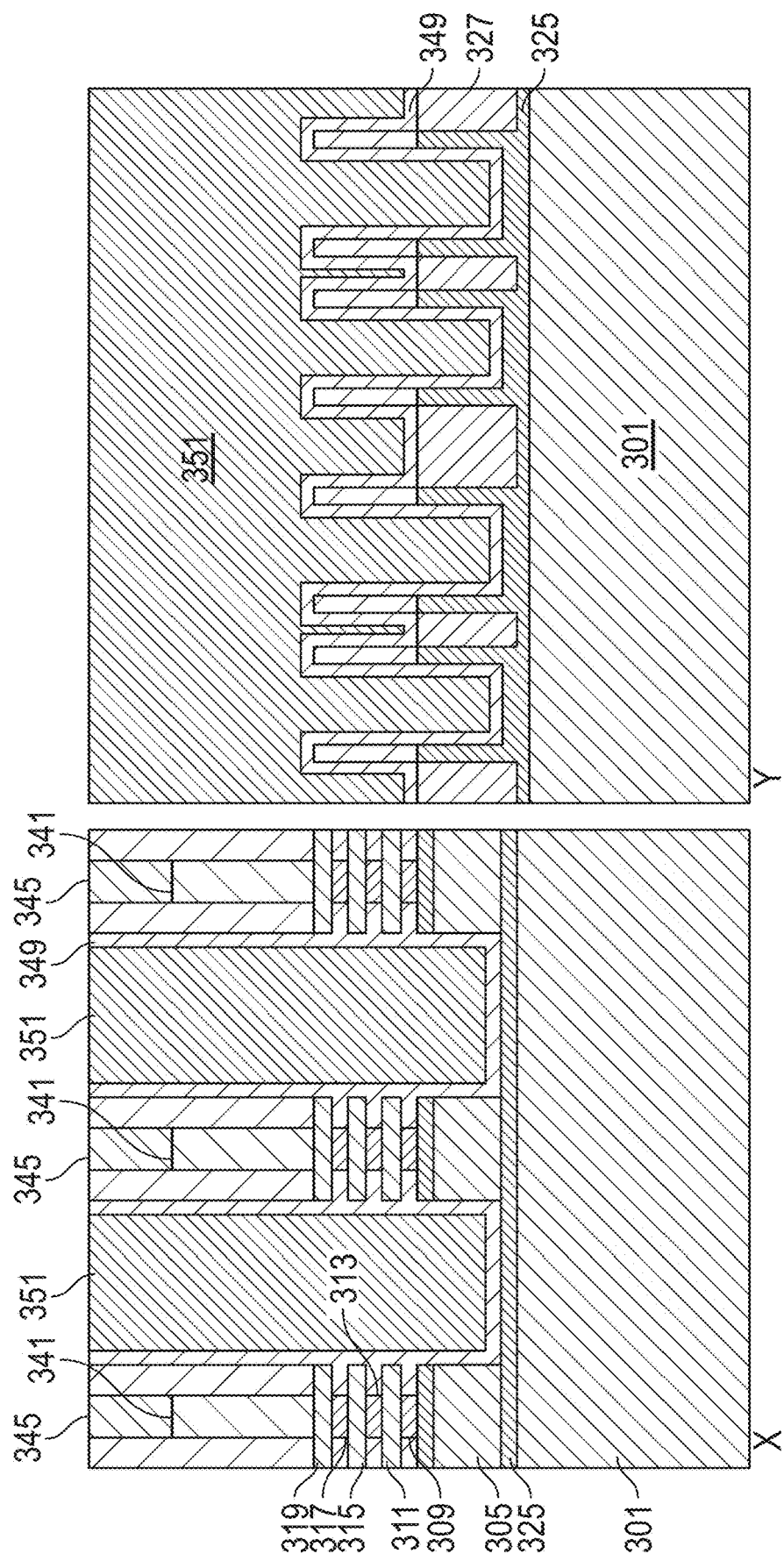
Figure 13:
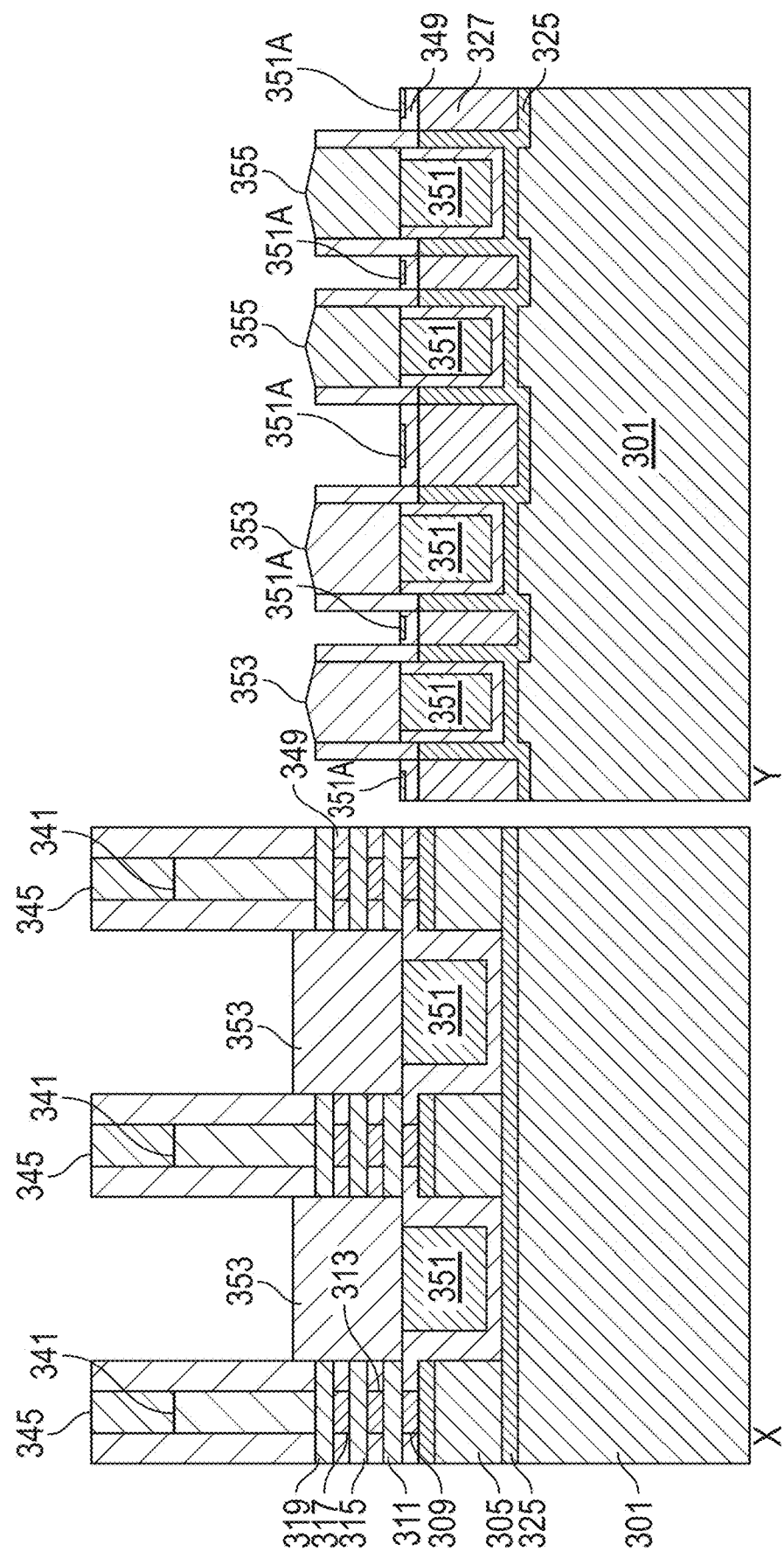

In FIG. 9, remove the hard mask 321 and recess the STI dielectric and dielectric liner to reveal the nanosheet stack, which now forms shallow trench isolation (STI) regions. In FIG. 10, form dummy gates 341 with gate hardmask 345 and spacers 343. In particular, deposit a thin layer of $SiO_2$ and amorphous Si (a-Si) material for the dummy gates 341 and carry out planarization; deposit gate hardmask material 345 (can be a multilayer dielectric); pattern the hardmask and etch the a-Si and the thin $SiO_2$ to form the dummy gates 341. In FIG. 11, form NS recesses 347; the recess process also etches through the upper liner 325 and Si layer 305, stopping over the lower liner 325. In FIG. 12, indent the SiGe 309, 313, 317; deposit inner spacer liner 349, such as SiN, SiBCN, SiOCN, etc.; and deposit a second dielectric layer 351 (e.g., SiC, or SiOC), followed by planarization by CMP. In FIG. 13, recess the second dielectric 351 below the bottom most semiconductor channel 311, etch back the inner spacer liner 349 (e.g., isotropically), and form the source/drain epitaxy (note N-doped epitaxial regions 353 and P-doped epitaxial regions 355). Further, note the remaining thin layer 351A of second dielectric layer material between the epitaxial regions 353, 355.

Figure 14:
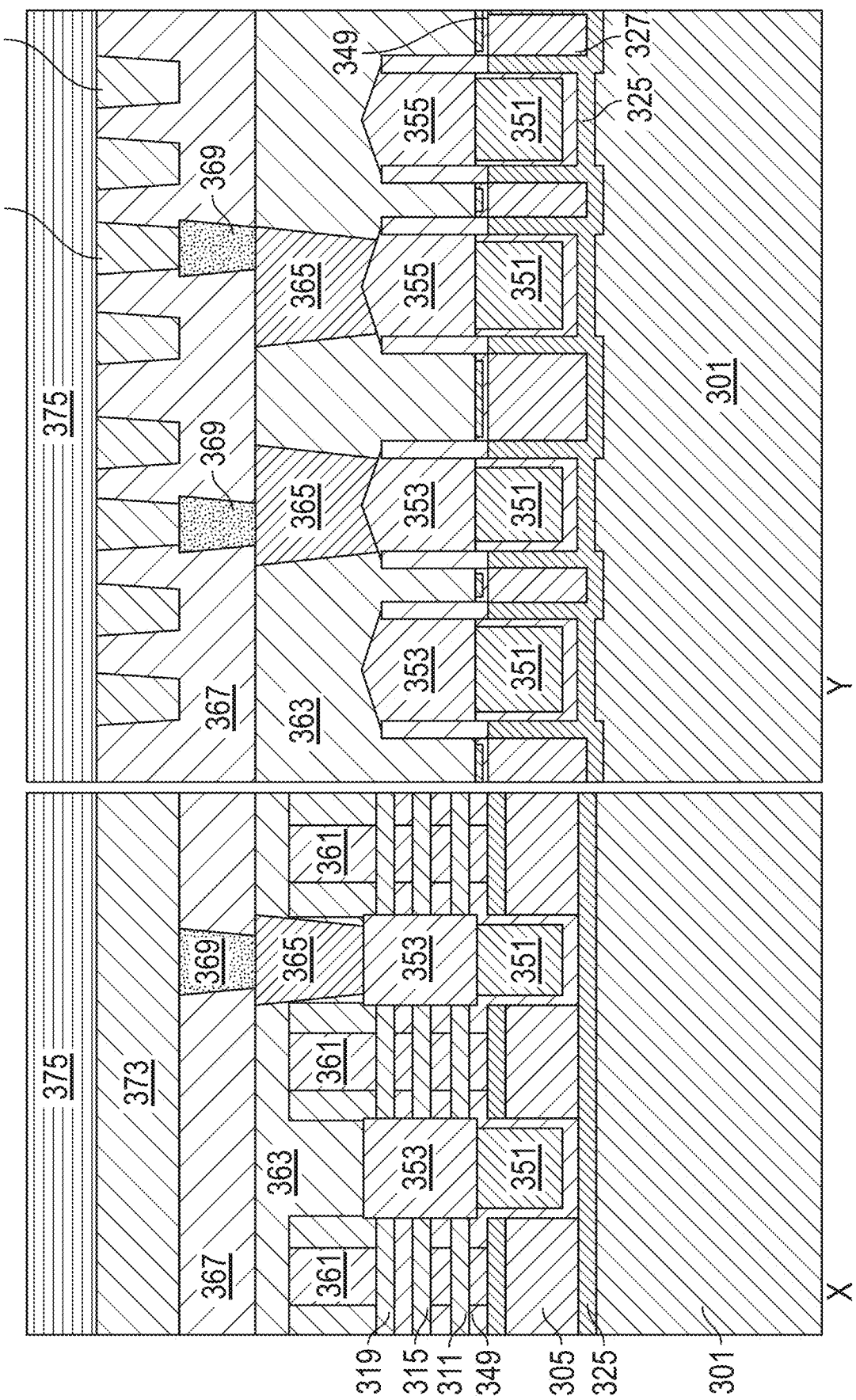

In FIG. 14, carry out conventional front end of line (FEOL) processing to complete the devices and carry out conventional middle of line (MOL) and back end of line (BEOL) processing for the wiring/interconnection. In particular, form the replacement high-K metal gates 361 after removal of dummy gates and sacrificial SiGe layers 309, 313 and 317; deposit inter-layer dielectric (ILD) 363; pattern, etch and metal fill to form source/drain contacts CA 365 and gate contacts CB (not shown); deposit BEOL ILD 367; pattern, etch, and fill to form first BEOL via VA 369; deposit additional BEOL ILD 367; and pattern again, etch and fill with metal to form first BEOL metal layer (M1) 373. More BEOL metal layers 375 are further formed over M1 373.

Figure 15:
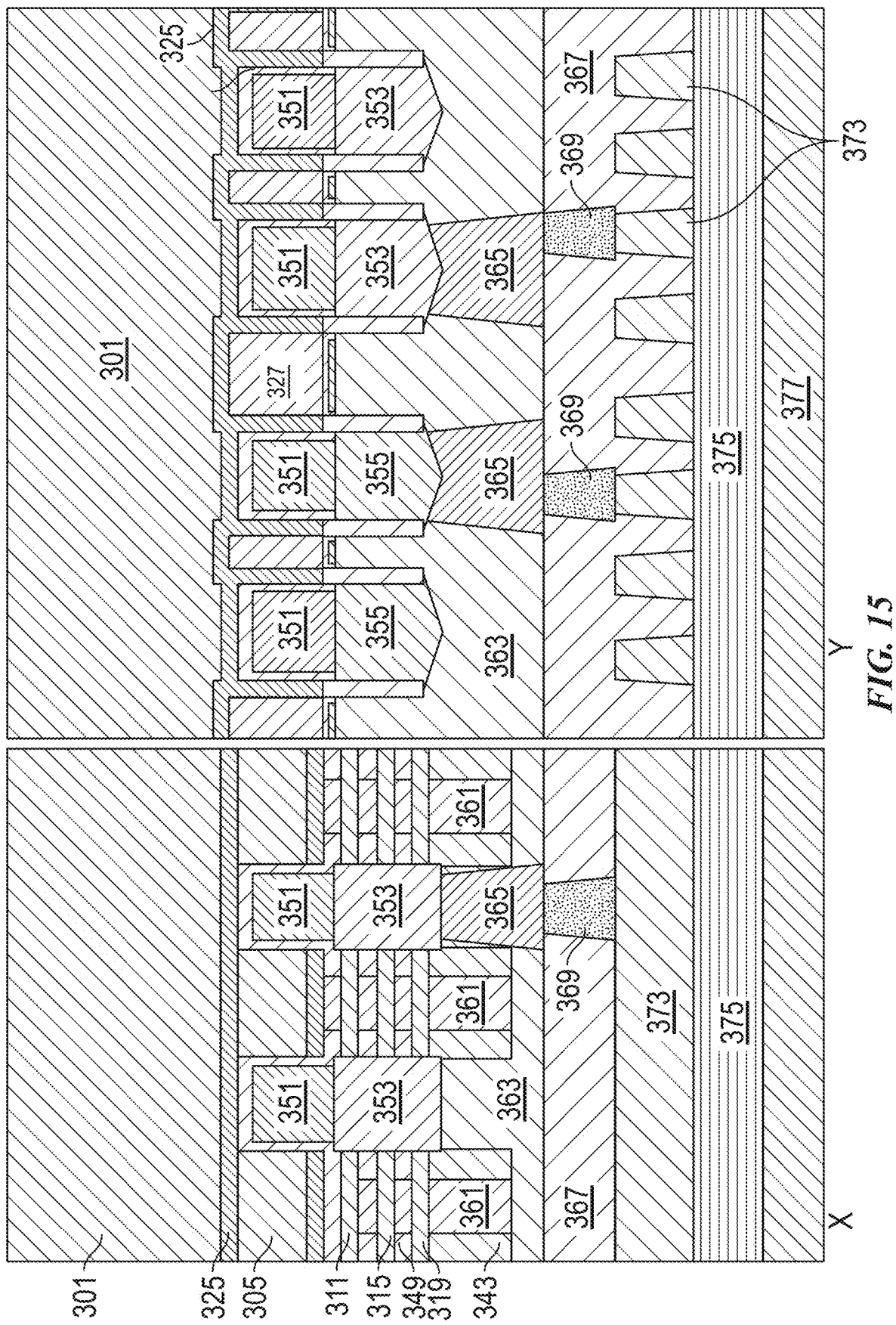
Figure 16:
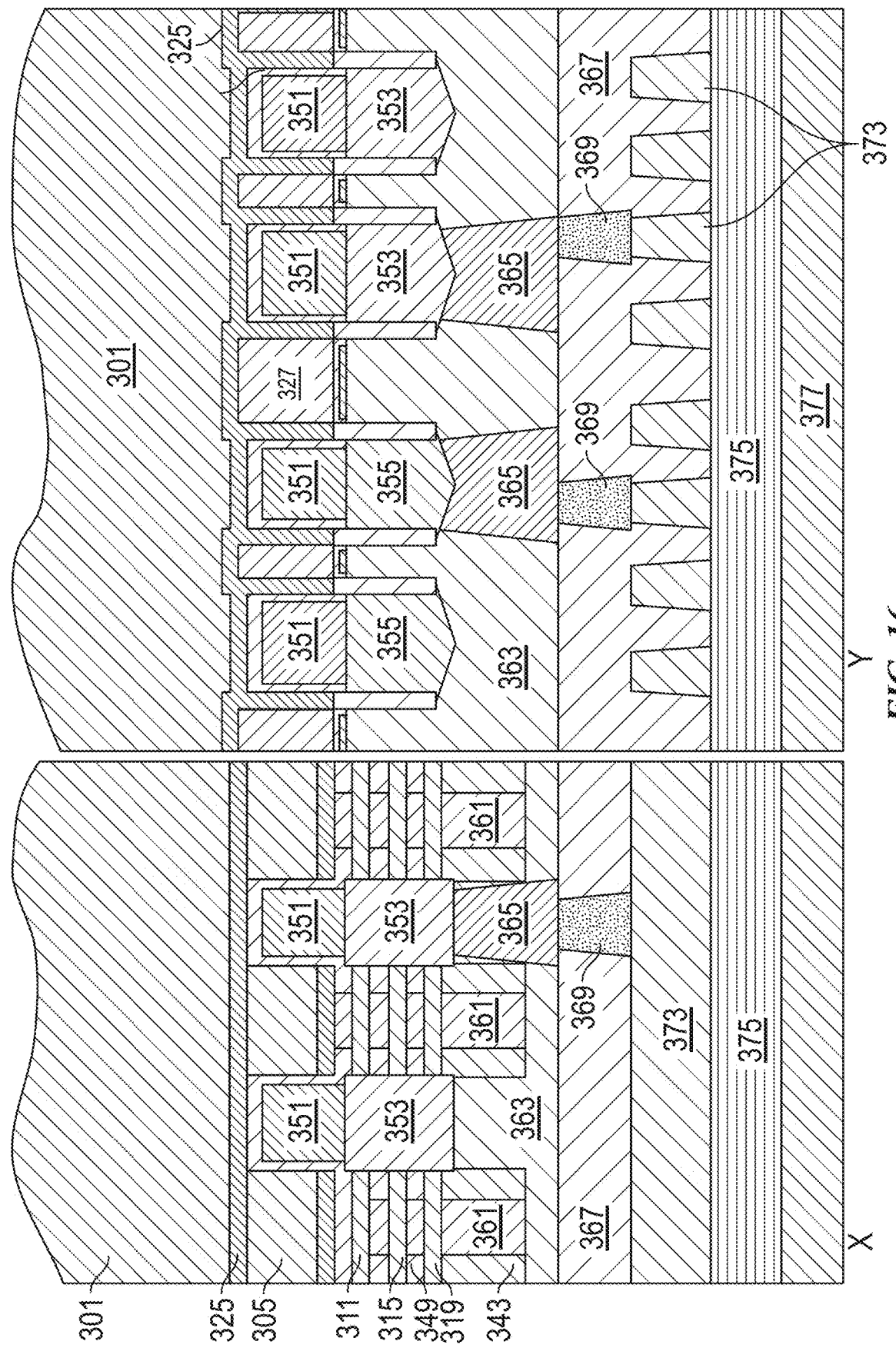
Figure 17:
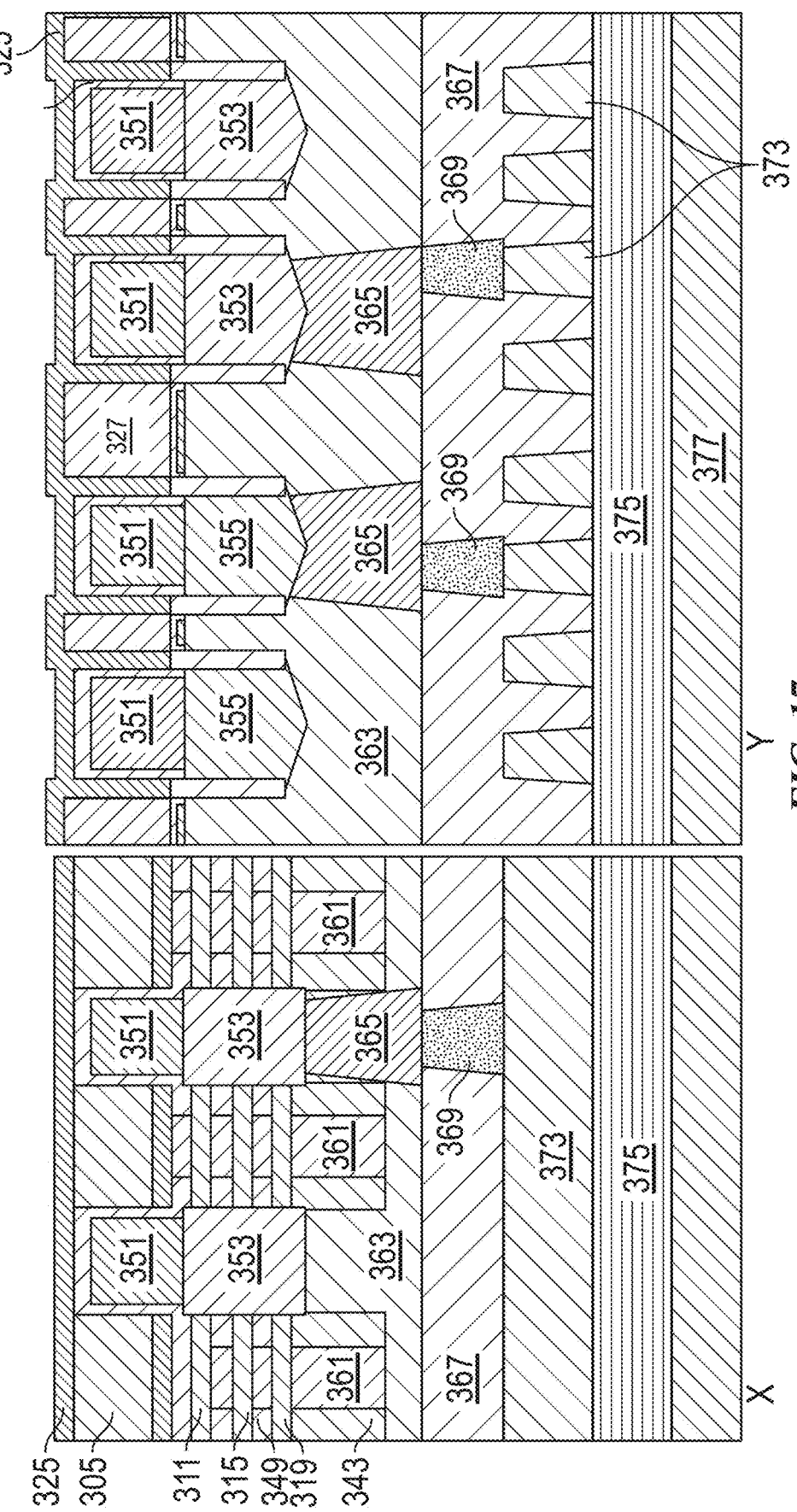
Figure 18:
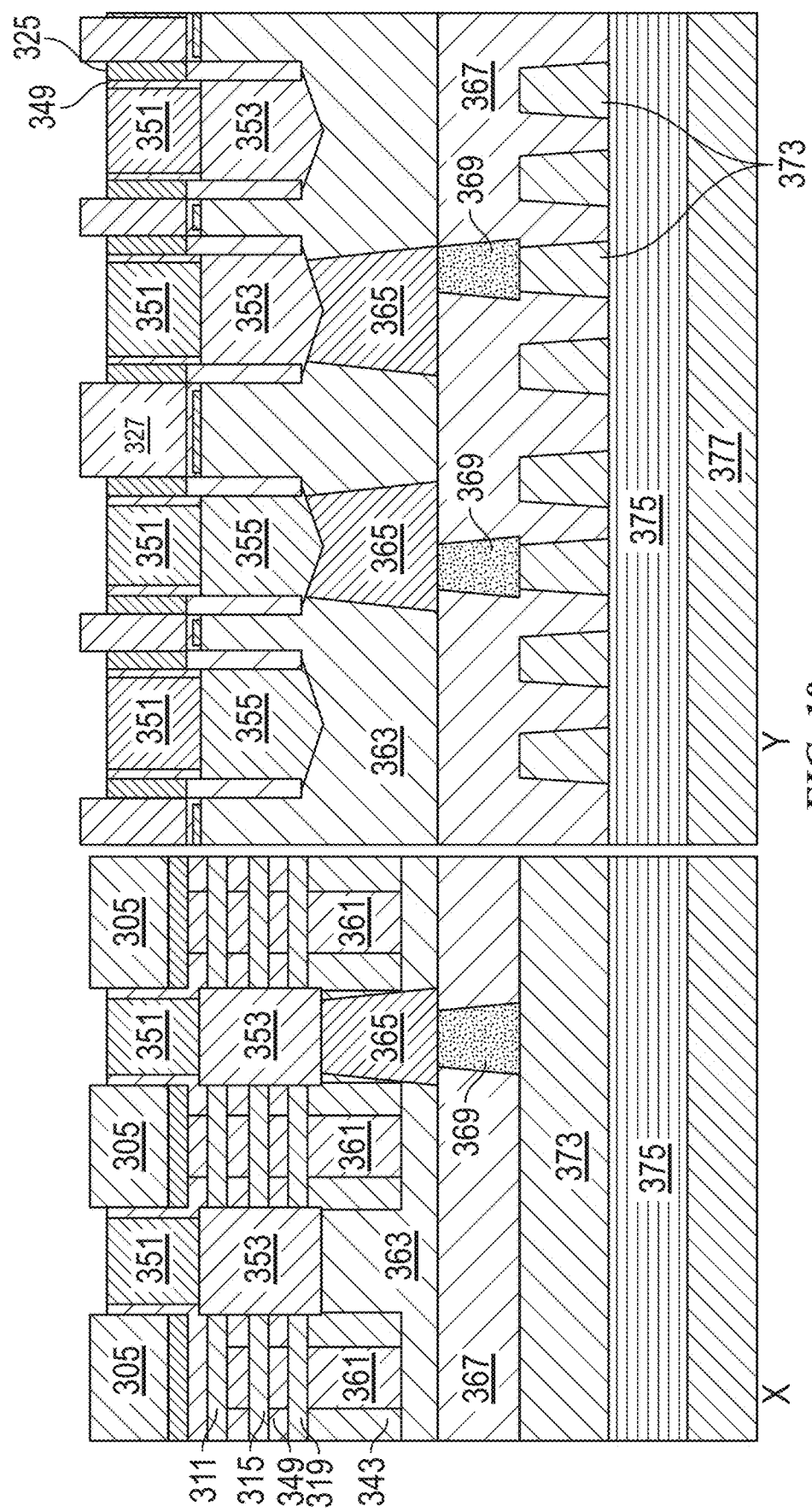
Figure 19:
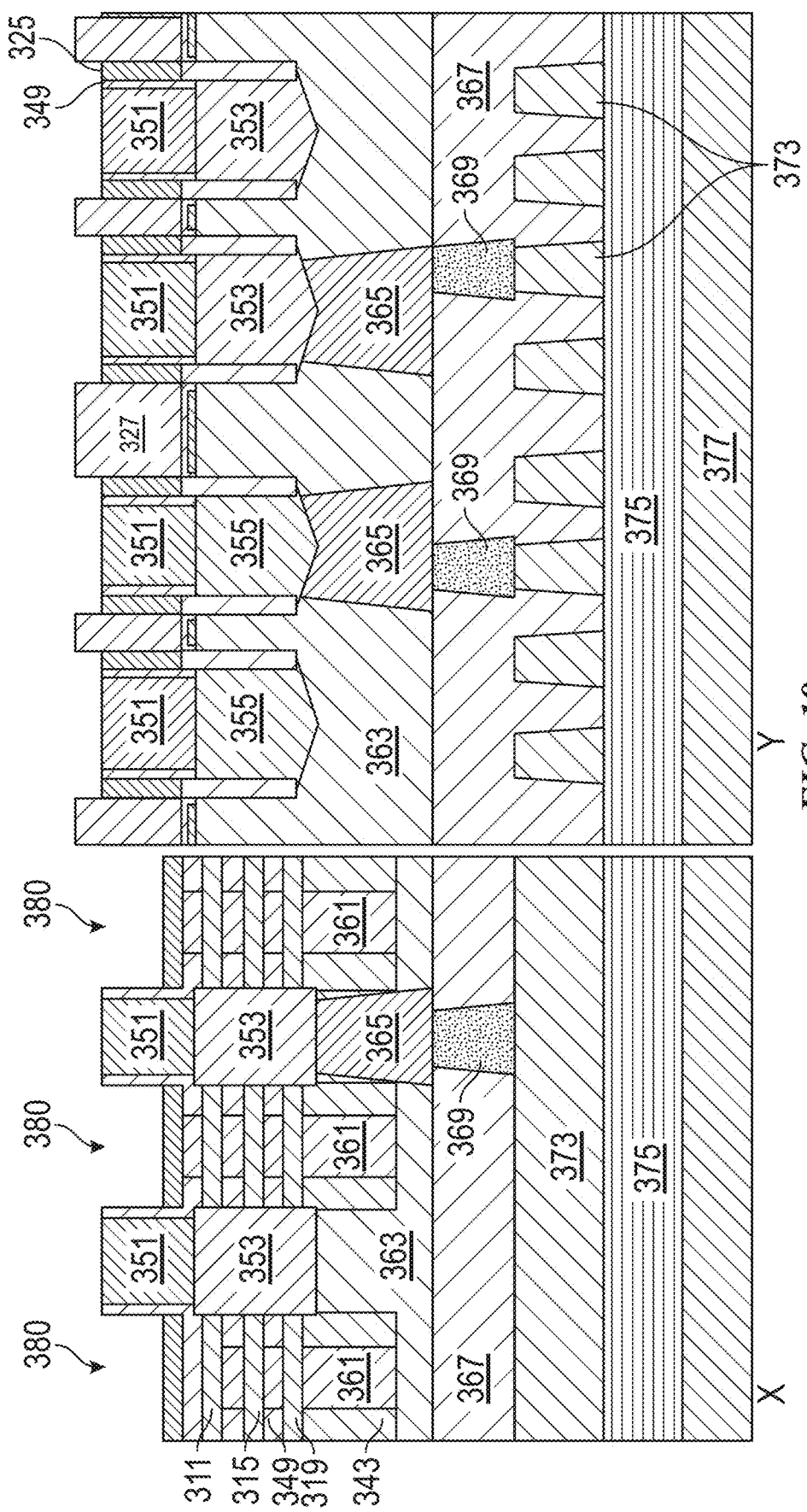
Figure 20:
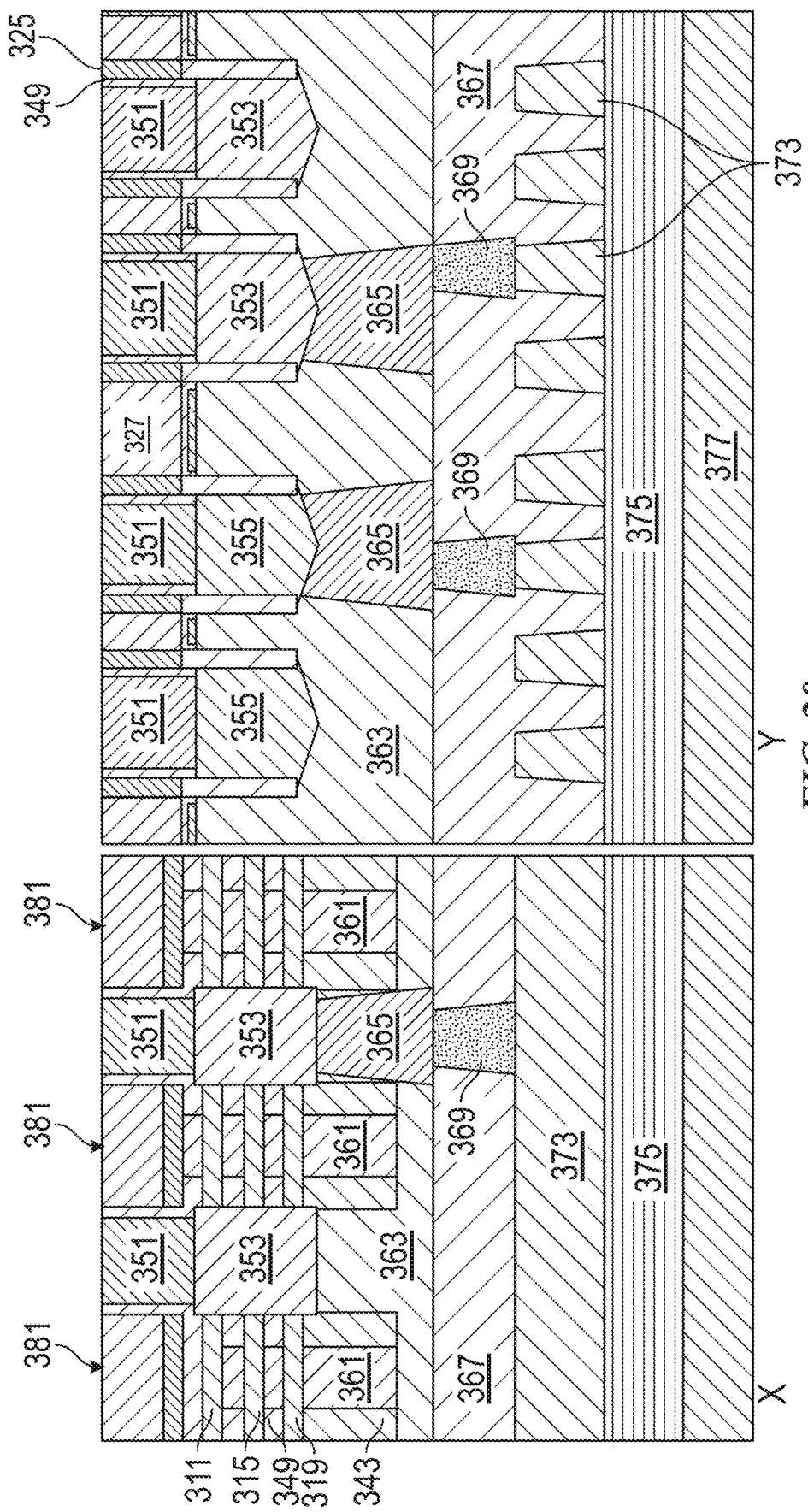

In FIG. 15, a carrier wafer 377 (e.g., conventional silicon) is bonded to the first wafer 301 over the top surface of the BEOL layer 375 using conventional dielectric bonding or Cu bonding processes. After that, the bonded wafer is flipped, so the backside of the first wafer 301 can be further processed. In FIG. 16, carry out an appropriate wafer thinning process on substrate 301; e.g., high etch rate wafer thinning such as grinding, CMP, or the like. In FIG. 17, carry out a lower etch rate removal, highly selective to Si, stopping on the first dielectric 325. In FIG. 18, the first dielectric 325 and the inner spacer liner 349 are etched to expose the STI 327, second dielectric 351, and Si layer 305. In FIG. 19, selectively remove the remaining Si layer 305 with respect to the surrounding materials. The inner spacer liner 349, first dielectric 325, and second dielectric 351 help in preventing any damage to the high-k metal gate 361 or S/D epi 355, 353. In FIG. 20, fill with dielectric 381 (e.g., $SiO_2$, low-K oxide (with k-value<3.9) followed by CMP).

Figure 21:
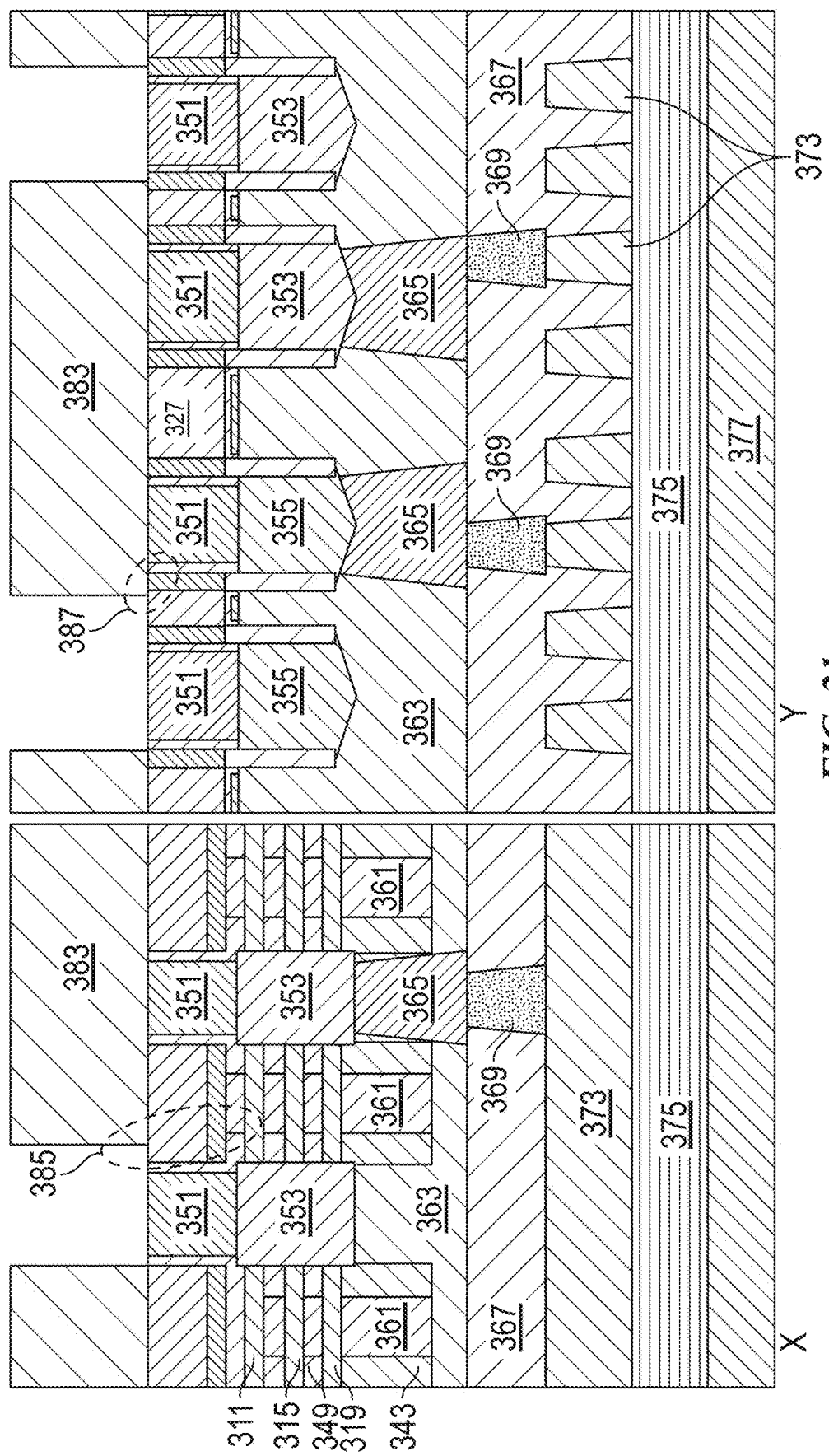
Figure 22:
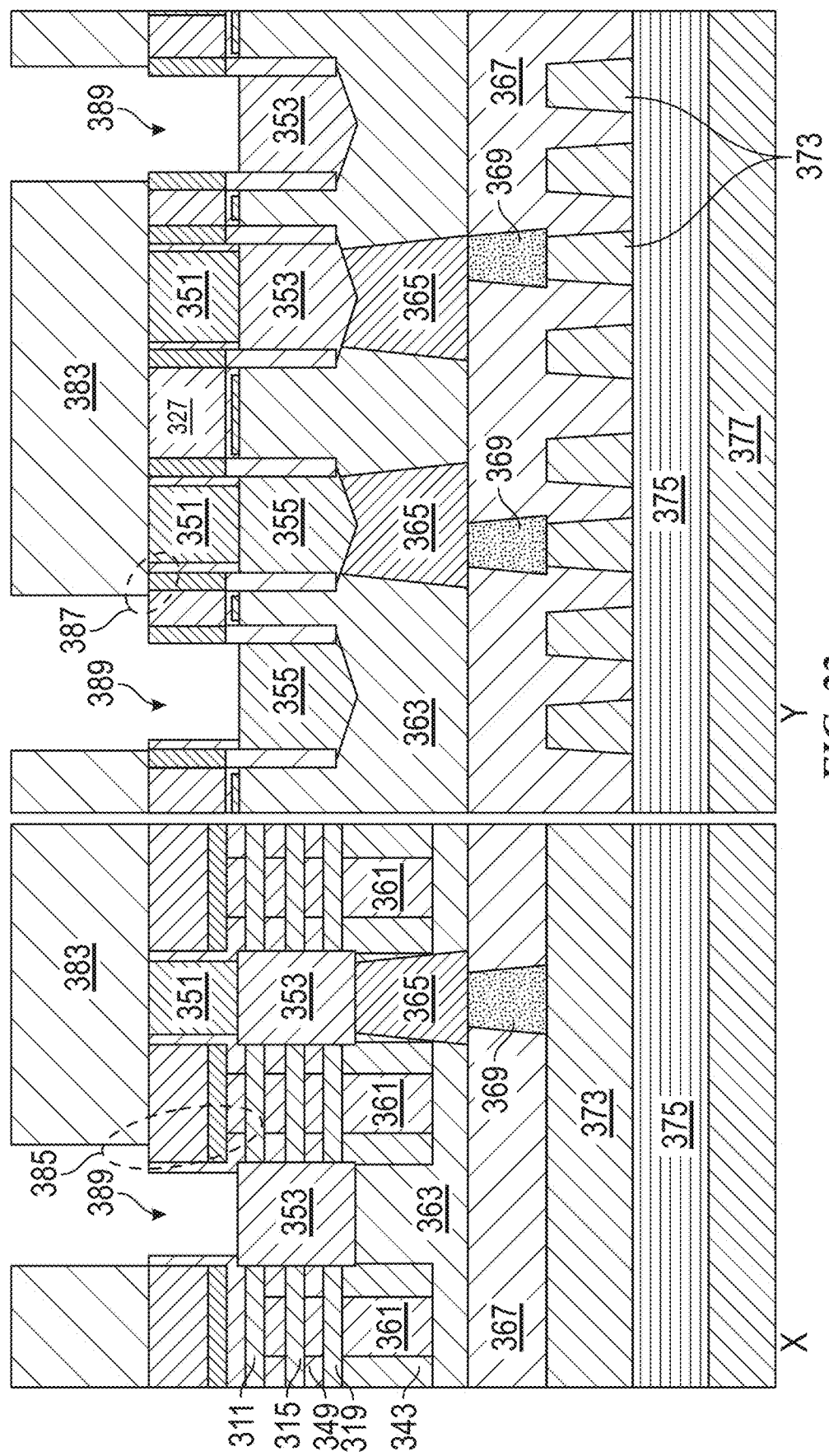
Figure 23:
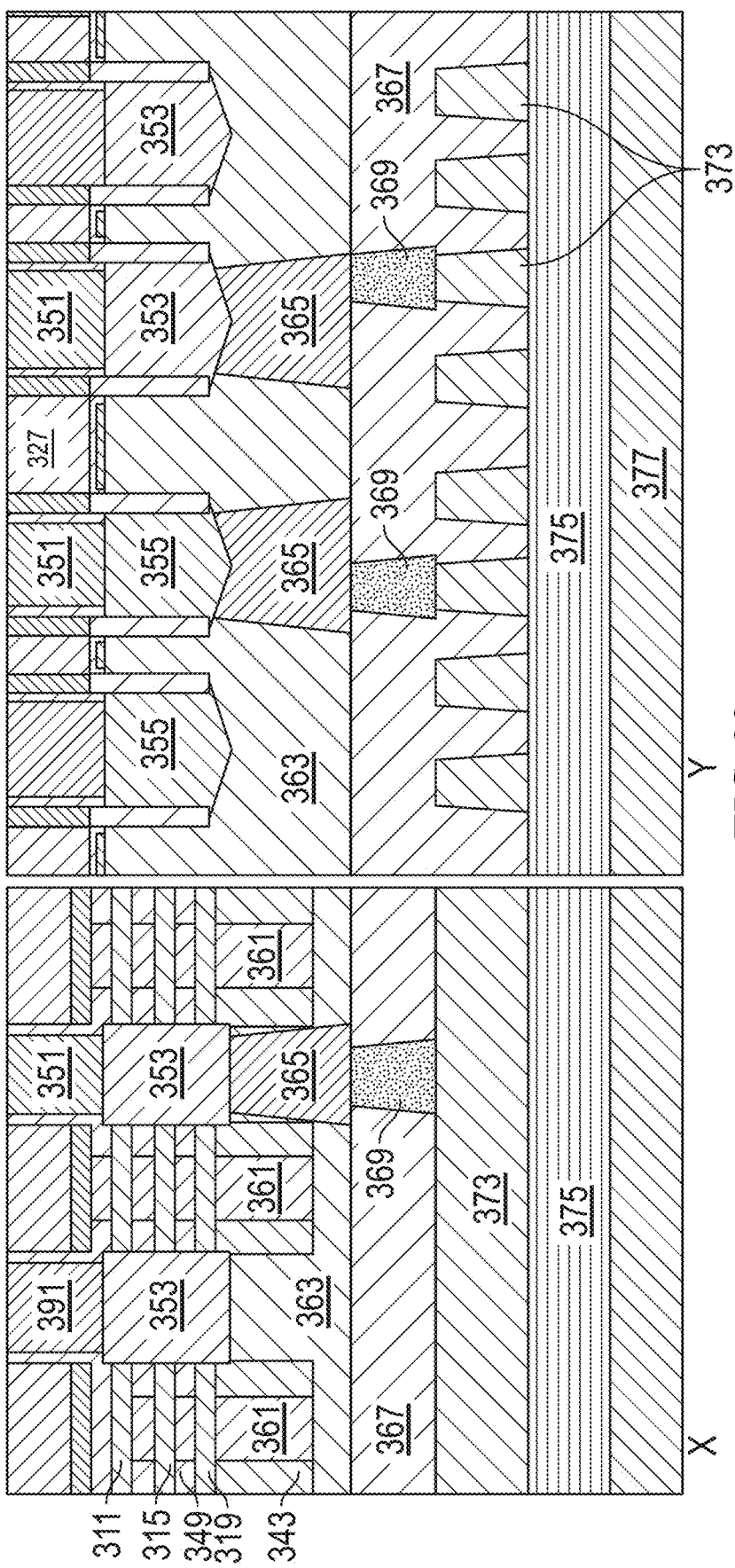

In FIG. 21, the backside contact VBPR is patterned first in a soft mask material 383 (e.g. organic planarization layer (OPL)), using conventional lithographic and etching processes. Note that backside lithography may have worse overlay and critical dimension (CD) control than frontside lithography; examples of misalignment can be seen at 385, 387, where the backside source/drain contact opening overlaps or nearly shorts to nearby gates or S/D region(s) of a neighboring device. In FIG. 22, selectively remove the second dielectric 351 leaving gaps 389, advantageously providing a two-dimensional self-aligned backside contact not only in the gate direction (X), but also in the source/drain direction (Y). As can be seen in FIG. 22, even though top openings in the soft mask 383 can potentially be misaligned to position that source/drain contact to short to gate (see X view) or source/drain contact to short to neighboring S/D (see Y view), the final contact position defined by cavity 389 is always well aligned to the source/drain epitaxy. In FIG. 23, carry out backside VBPR metallization as seen at 391. Advantageously, the VBPR are self-aligned to the S/D epitaxy 353, 355, and there is no concern regarding a VBPR-to-gate short or a VBPR-to-nearby epi short, as discussed just above. To obtain the final structure shown in FIG. 2, form the BPR 393 and BSPDN 395 (VDD refers to the power supply pin connected to PFETs while VSS refers to the power supply pin connected to NFETs). Note the BPR and BSPDN are formed within backside ILD (BILD) 399.

Thus, it will be appreciated that in one aspect, an exemplary fabrication method includes forming a bottom portion of the first dielectric liner 325 under STI region 327 and a bi-layer portion of the first dielectric liner 325 under the active region, with Si layer 305 existing between the layers of the bi-layer portion of the first dielectric liner 325. A further step (FIG. 11) includes recessing the active layers, the top first dielectric liner, and the Si layer 305 between the bi-layer dielectric liner under the S/D region, forming a recessed cavity 347 over the bottom first dielectric layer. Still further steps include forming a second dielectric 351 in the recessed cavity (FIG. 12) and forming S/D epi 353, 355 over the second dielectric 351. After wafer flipping (FIG. 15), remove the substrate 301, stopping on the bottom first dielectric liner 325 (FIGS. 16 and 17). Remove a portion of the bottom portion of the first dielectric liner 325 under STI region 327 (FIG. 18), a first layer of the bi-layer portion of the first dielectric liner 325 and the Si layer 305 between the bi-layer first dielectric liner under the active region (FIG. 19), forming cavities 380 under the gates. As per FIG. 20, form a different dielectric 381 (different than the second dielectric) into the cavities under the gates. Selectively remove the second dielectric 351 down to the surrounding materials under the backside VBPR opening (creating cavities 389 in FIG. 22). Form the backside VBPR metallization 391 (FIG. 23).

Given the discussion thus far, it will be appreciated that in one aspect, an exemplary semiconductor structure includes a field effect transistor (FET) including a FET first source-drain region, a FET second source-drain region, a FET gate between the first and second source-drain regions, and a FET channel region under the FET gate and between the FET first and second source-drain regions. Regions 353, 355 are exemplary of the source-drain regions. Gates 361 are exemplary of the gates. Note semiconductor channel layers 311, 315, 319, for example. Also included are a front side wiring network, having a plurality of front side wires, on a front side of the field effect transistor (FET) (e.g., M1 373 and BEOL wiring 375); a front side conductive path 365, 369 electrically interconnecting one of the front side wires with the FET first source-drain region; and a back side power rail 393, on a back side of the field effect transistor (FET). A back side contact 391 electrically interconnects the back side power rail with the FET second source-drain region. A dielectric liner 325 and back side dielectric fill 381 are located on a back side of the FET gate adjacent the back side contact; the dielectric liner and back side dielectric fill electrically confine the back side contact in a cross-gate direction.

One or more embodiments further include a shallow trench isolation liner 349 and shallow trench isolation material 327 on the back side of the first FET adjacent the back side contact, the shallow trench isolation liner and shallow trench isolation material electrically confining the back side contact in a cross-fin direction.

One or more embodiments further include a second dielectric material 351 on a back side of the FET first source-drain region. Thus, in one or more embodiments, a back side dielectric 351 electrically isolates the back side power rail 393 from a source-drain region which is wired to the front side network (e.g., using 365, 369) (i.e., the second dielectric material electrically separates the FET first source-drain region from the back side power rail).

One or more embodiments still further include a back side power distribution network 395 electrically interconnected with the back side power rail 393.

One or more embodiments even further include a layer 351A of the second dielectric material 351 on a front side of the shallow trench isolation liner 349.

In a non-limiting example, the FETs are nanosheet FETs.

In another aspect, a semiconductor array structure includes a plurality of p-type field effect transistors (PFETs), each including a PFET source, a PFET drain, a PFET gate between the PFET source and the PFET drain, and a PFET channel region under the PFET gate and between the PFET drain and the PFET source. Regions 355 are exemplary of the sources and drains. Gates 361 are exemplary of the gates. Note semiconductor channel layers 311, 315, 319, for example. Note that view 102 in FIG. 2 depicts N-epi but is equally representative of P-epi viewed along line X.

Also included are a plurality of n-type field effect transistors (NFETs), each including an NFET source, an NFET drain, an NFET gate between the NFET source and the NFET drain, and an NFET channel region under the NFET gate and between the NFET drain and the NFET source. Regions 353 are exemplary of the sources and drains. Gates 361 are exemplary of the gates. Note semiconductor channel layers 311, 315, 319, for example.

The array structure even further includes a front side wiring network, having a plurality of front side wires, on a front side of the plurality of p-type field effect transistors and the plurality of n-type field effect transistors (e.g., M1 373 and BEOL wiring 375); a plurality of first front side conductive paths 365, 369 electrically interconnecting first selected ones of the front side wires with the NFET drains; a plurality of second front side conductive paths 365, 369 electrically interconnecting second selected ones of the front side wires with the PFET sources; a plurality of drain back side power rails 393 VDD, disposed by a back side of the p-type field effect transistors; and a plurality of source back side power rails 393 VSS, disposed by a back side of the n-type field effect transistors. A plurality of drain back side contacts 391 electrically interconnect the plurality of drain back side power rails with the drains of the p-type field effect transistors; and a plurality of source back side contacts 391 electrically interconnect the plurality of source back side power rails with the sources of the n-type field effect transistors.

The array structure still further includes a dielectric liner 325 and back side dielectric fill 381 on a back side of the PFET gate and a back side of the NFET gate respectively adjacent the drain back side contacts and the source back side contacts. The dielectric liner and back side dielectric fill electrically confine the drain back side contacts and the source back side contacts in a cross-gate direction.

One or more embodiments further include a shallow trench isolation liner 349 and shallow trench isolation material 327 on a back side of the PFET and a back side of the NFET respectively adjacent the drain back side contacts and the source back side contacts. The shallow trench isolation liner and shallow trench isolation material electrically confine the drain back side contacts and the source back side contacts in a cross-fin direction.

One or more embodiments further include a second dielectric material 351 on a back side of the PFET source and the NFET drain. Thus, in one or more embodiments, a back side dielectric 351 electrically isolates the drain back side power rail 393 VDD from a PFET which is wired to the front side network (e.g., using 365, 369) and also electrically isolates the source back side power rail 393 VSS from an NFET drain which is wired to the front side network (e.g., using 365, 369).

One or more embodiments still further include a back side power distribution network 395 electrically interconnected with the plurality of drain back side power rails 393 VDD and the plurality of source back side power rails 393 VSS.

One or more embodiments even further include a layer 351A of the second dielectric material 351 on a front side of the shallow trench isolation liner 349.

As noted, in a non-limiting example, the FETs are nanosheet FETs.

In one or more embodiments, the front side metal features are tapered with a larger cross section towards the front side while the back side metal features are tapered with a larger cross section towards the back side.

In still another aspect, referring to FIG. 10, an exemplary method of forming a semiconductor array structure, includes providing a first precursor structure. The first precursor structure includes a substrate 301; an inner portion of a first dielectric liner 325 outward of the substrate; a silicon layer 305 outward of the inner portion of the first dielectric liner; an outer portion of the first dielectric liner 325 outward of the silicon layer; and a plurality of fin stacks outward of the outer portion of the first dielectric layer. The plurality of fin stacks include alternating layers of silicon and silicon germanium 309-319 with sidewall spacers 343 thereon. There are a plurality of air gaps defined between the fin stacks. A plurality of shallow trench isolation regions 327 are located in the inner portion of the first dielectric liner, the silicon layer, and the outer portion of the first dielectric liner inward of the gaps. A plurality of dummy gates 341 are located across and outward of the plurality of fin stacks.

Referring to FIG. 11, a further step includes recessing selected portions of the fin stacks, the outer portion of the first dielectric liner 325 inward of the selected portions of the fin stacks, and the silicon layer 305 inward of the selected portions of the fin stacks under the outer portion of the first dielectric liner, to create gaps 347 for source-drain formation.

Referring to FIGS. 12 and 13, a still further step includes forming a second dielectric 351 in the source-drain formation gaps and epitaxially growing source-drain regions 353, 355 over the second dielectric 351 to create a second precursor structure.

Referring to FIG. 14, an even further step includes replacing the dummy gates with metal replacement gate structures 361.

As seen in FIGS. 16 and 17, another step includes removing the substrate 301, down to the inner portion of a first dielectric liner 325. Additional steps include removing the inner portion of the first dielectric liner 325 (as seen in FIG. 18); removing the silicon layer 305 between the second dielectric 351 in the source-drain formation gaps to form cavities 380 under the gates (as seen in FIG. 19); forming a third dielectric 381, different than the second dielectric, into the cavities under the gates (as seen in FIG. 20); selectively removing the second dielectric 351 down to selected ones of the source-drain regions to create via to back side power rail openings (see creation of cavities 389 in FIG. 22); and forming the backside vias 391 to back side power rails in the via to back side power rail openings (as seen in FIG. 23).

Referring to FIG. 15, one or more embodiments further include flipping the second precursor structure prior to removing the substrate 301 down to the inner portion of the first dielectric liner.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. For example, the skilled artisan will be familiar with epitaxial growth, self-aligned contact formation, formation of high-K metal gates, and so on. The term "high-K" has a definite meaning to the skilled artisan in the context of high-K metal gate (HKMG) stacks, and is not a mere relative term. Moreover, one or more of the processing steps and tooling used to fabricate semiconductor devices are also described in a number of readily available publications, including, for example: James D. Plummer et al., *Silicon VLSI Technology: Fundamentals, Practice, and Modeling* 1$^{st}$ *Edition*, Prentice Hall, 2001 and P. H. Holloway et al., *Handbook of Compound Semiconductors: Growth, Processing, Characterization, and Devices*, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Those skilled in the art will appreciate that the exemplary structures discussed above can be distributed in raw form (i.e., a single wafer having multiple unpackaged chips), as bare dies, in packaged form, or incorporated as parts of intermediate products or end products.

An integrated circuit in accordance with aspects of the present inventions can be employed in essentially any application and/or electronic system. Given the teachings of the present disclosure provided herein, one of ordinary skill in the art will be able to contemplate other implementations and applications of embodiments disclosed herein.

Figure 24:
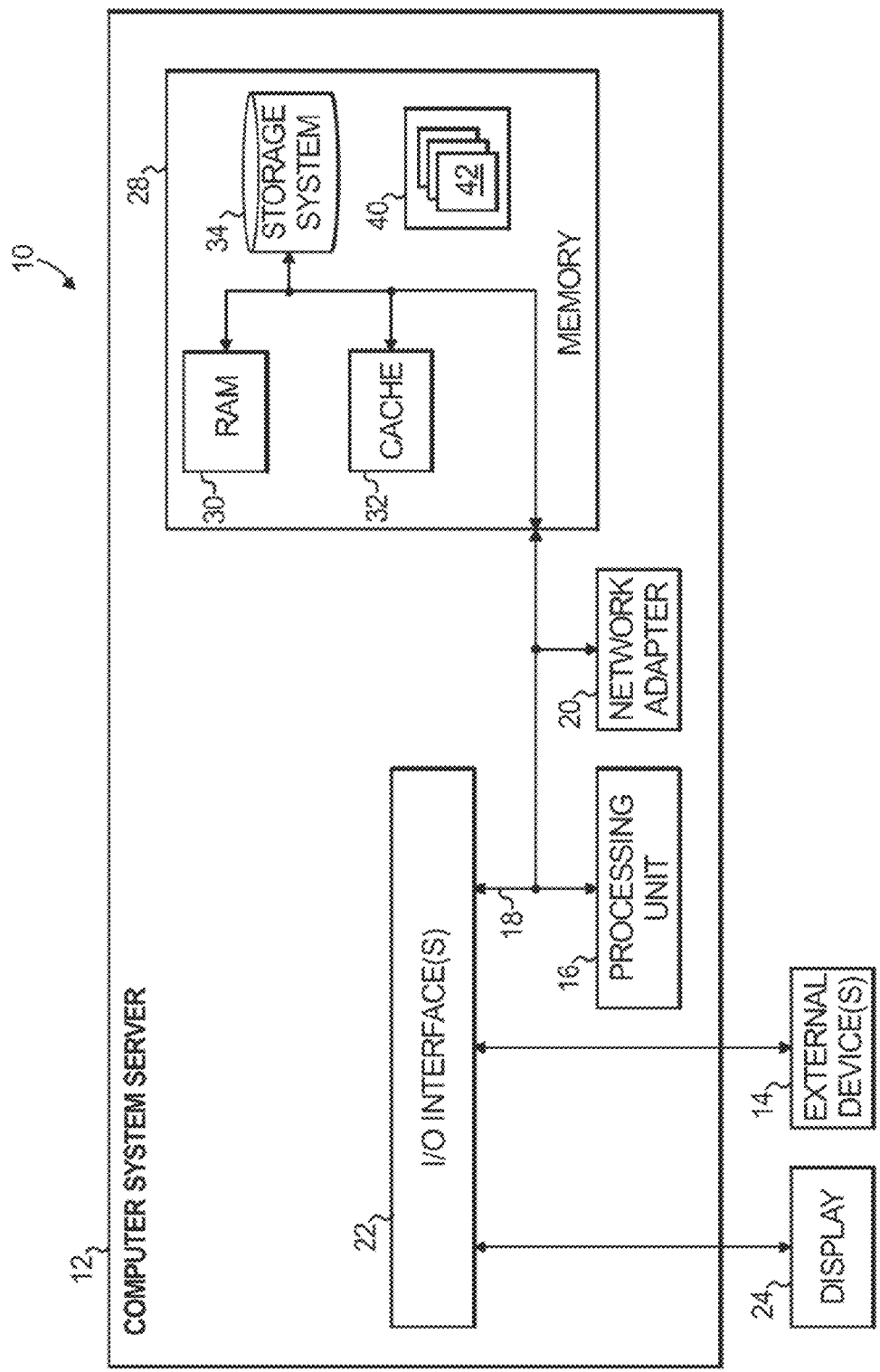
FIG. 24 depicts a computer system that may be useful in implementing one or more aspects and/or elements of the invention.

Some aspects of the invention, or elements thereof, can be implemented in the form of an apparatus including a memory and at least one processor that is coupled to the memory and operative to perform exemplary method steps. FIG. 24 depicts a computer system that may be useful in implementing one or more aspects and/or elements of the invention; it is referred to herein as a cloud computing node but is also representative of a server, general purpose-computer, etc. which may be provided in a cloud or locally. Note that such a computer can control semiconductor design and/or fabrication.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 24, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, and external disk drive arrays, RAID systems, tape drives, and data archival storage systems, etc.

Thus, one or more embodiments can make use of software (e.g., for semiconductor design and/or fabrication) running on a general purpose computer or workstation. With reference to FIG. 24, such an implementation might employ, for example, a processor 16, a memory 28, and an input/output interface 22 to a display 24 and external device(s) 14 such as a keyboard, a pointing device, or the like. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory) 30, ROM (read only memory), a fixed memory device (for example, hard drive 34), a removable memory device (for example, diskette), a flash memory and the like. In addition, the phrase "input/output interface" as used herein, is intended to contemplate an interface to, for example, one or more mechanisms for inputting data to the processing unit (for example, mouse), and one or more mechanisms for providing results associated with the processing unit (for example, printer). The processor 16, memory 28, and input/output interface 22 can be interconnected, for example, via bus 18 as part of a data processing unit 12. Suitable interconnections, for example via bus 18, can also be provided to a network interface 20, such as a network card, which can be provided to interface with a computer network, and to a media interface, such as a diskette or CD-ROM drive, which can be provided to interface with suitable media.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 16 coupled directly or indirectly to memory elements 28 through a system bus 18. The memory elements can include local memory employed during actual implementation of the program code, bulk storage, and cache memories 32 which provide temporary storage of at least some program code in order to reduce the number of times code must be retrieved from bulk storage during implementation.

Input/output or I/O devices (including but not limited to keyboards, displays, pointing devices, and the like) can be coupled to the system either directly or through intervening I/O controllers.

Network adapters 20 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 12 as shown in FIG. 24) running a server program. It will be understood that such a physical server may or may not include a display and keyboard.

Figure 25:
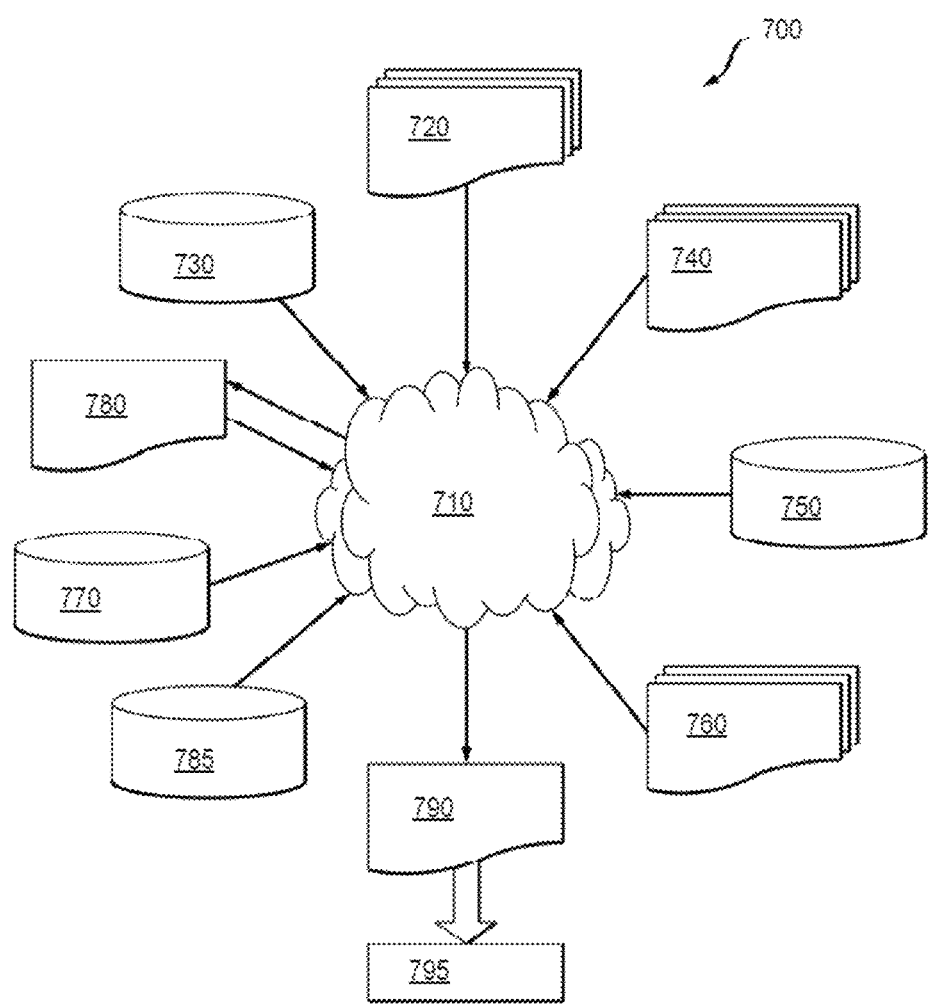
FIG. 25 is a flow diagram of a design process used in semiconductor design, manufacture, and/or test.

It should be noted that any of the methods described herein can include an additional step of providing a system comprising distinct software modules embodied on a computer readable storage medium; the modules can include, for example, any or all of the appropriate elements depicted in FIG. 25. The method steps can then be carried out using the distinct software modules and/or sub-modules of the system, as described herein, executing on one or more hardware processors such as 16. Further, a computer program product can include a computer-readable storage medium with code adapted to be implemented to carry out one or more method steps described herein, including the provision of the system with the distinct software modules. In one or more embodiments, the computer readable storage medium embodying code and/or design structure, is non-transitory.

One example of user interface that could be employed in some cases is hypertext markup language (HTML) code served out by a server or the like, to a browser of a computing device of a user. The HTML is parsed by the browser on the user's computing device to create a graphical user interface (GUI).

Exemplary Design Process Used in Semiconductor Design, Manufacture, and/or Test

One or more embodiments make use of computer-aided semiconductor integrated circuit design simulation, test, layout, and/or manufacture. In this regard, FIG. 25 shows a block diagram of an exemplary design flow 700 used for example, in semiconductor IC logic design, simulation, test, layout, and manufacture. Design flow 700 includes processes, machines and/or mechanisms for processing design structures or devices to generate logically or otherwise functionally equivalent representations of design structures and/or devices, such as those that can be analyzed using techniques disclosed herein or the like. The design structures processed and/or generated by design flow 700 may be encoded on machine-readable storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 700 may vary depending on the type of representation being designed. For example, a design flow 700 for building an application specific IC (ASIC) may differ from a design flow 700 for designing a standard component or from a design flow 700 for instantiating the design into a programmable array, for example a programmable gate array (PGA) or a field programmable gate array (FPGA) offered by Altera® Inc. or Xilinx® Inc.

FIG. 25 illustrates multiple such design structures including an input design structure 720 that is preferably processed by a design process 710. Design structure 720 may be a logical simulation design structure generated and processed by design process 710 to produce a logically equivalent functional representation of a hardware device. Design structure 720 may also or alternatively comprise data and/or program instructions that when processed by design process 710, generate a functional representation of the physical structure of a hardware device. Whether representing functional and/or structural design features, design structure 720 may be generated using electronic computer-aided design (ECAD) such as implemented by a core developer/designer. When encoded on a gate array or storage medium or the like, design structure 720 may be accessed and processed by one or more hardware and/or software modules within design process 710 to simulate or otherwise functionally represent an electronic component, circuit, electronic or logic module, apparatus, device, or system. As such, design structure 720 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 710 preferably employs and incorporates hardware and/or software modules for synthesizing, translating, or otherwise processing a design/simulation functional equivalent of components, circuits, devices, or logic structures to generate a Netlist 780 which may contain design structures such as design structure 720. Netlist 780 may comprise, for example, compiled or otherwise processed data structures representing a list of wires, discrete components, logic gates, control circuits, I/O devices, models, etc. that describes the connections to other elements and circuits in an integrated circuit design. Netlist 780 may be synthesized using an iterative process in which netlist 780 is resynthesized one or more times depending on design specifications and parameters for the device. As with other design structure types described herein, netlist 780 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or other suitable memory.

Design process 710 may include hardware and software modules for processing a variety of input data structure types including Netlist 780. Such data structure types may reside, for example, within library elements 730 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 740, characterization data 750, verification data 760, design rules 770, and test data files 785 which may include input test patterns, output test results, and other testing information. Design process 710 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 710 without deviating from the scope and spirit of the invention. Design process 710 may also include modules for performing standard circuit design processes such as timing analysis, verification, design rule checking, place and route operations, etc.

Design process 710 employs and incorporates logic and physical design tools such as HDL compilers and simulation model build tools to process design structure 720 together with some or all of the depicted supporting data structures along with any additional mechanical design or data (if applicable), to generate a second design structure 790. Design structure 790 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 720, design structure 790 preferably comprises one or more files, data structures, or other computer-encoded data or instructions that reside on data storage media and that when processed by an ECAD system generate a logically or otherwise functionally equivalent form of one or more IC designs or the like. In one embodiment, design structure 790 may comprise a compiled, executable HDL simulation model that functionally simulates the devices to be analyzed.

Design structure 790 may also employ a data format used for the exchange of layout data of integrated circuits and/or symbolic data format (e.g. information stored in a GDSII (GDS2), GL1, OASIS, map files, or any other suitable format for storing such design data structures). Design structure 790 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described herein (e.g., .lib files). Design structure 790 may then proceed to a stage 795 where, for example, design structure 790: proceeds to tape-out, is released to manufacturing, is released to a mask house, is sent to another design house, is sent back to the customer, etc.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment (s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "bottom", "top", "above", "over", "under" and "below" are used to indicate relative positioning of elements or structures to each other as opposed to relative elevation. If a layer of a structure is described herein as "over" another layer, it will be understood that there may or may not be intermediate elements or layers between the two specified layers. If a layer is described as "directly on" another layer, direct contact of the two layers is indicated. As the term is used herein and in the appended claims, "about" means within plus or minus ten percent.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.76(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus, the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A semiconductor structure comprising:
a field effect transistor (FET) comprising a FET first source-drain region, a FET second source-drain region, a FET gate between the FET first and second source-drain regions, and a FET channel region defining a fin under the FET gate and between the FET first and second source-drain regions;
a front side wiring network, having a plurality of front side wires, on a front side of the field effect transistor (FET);
a front side conductive path electrically interconnecting one of the front side wires with the FET first source-drain region;
a back side power rail, on a back side of the field effect transistor (FET);
a back side contact electrically interconnecting the back side power rail with the FET second source-drain region;
a dielectric liner covering a back side of the FET gate and disposed at a level adjacent to a sidewall of the back side contact;
a back side dielectric fill on the dielectric liner on the back side of the FET gate and disposed at a level adjacent to the sidewall of the back side contact;
a shallow trench isolation liner, wherein a first portion of the shallow trench isolation liner is disposed at a level coplanar to a sidewall of the FET gate, and wherein a second portion of the shallow trench isolation liner separates the dielectric liner from the sidewall of the back side contact; and
a shallow trench isolation material disposed at the level adjacent to the sidewall of the back side contact and defining a shallow trench isolation region,
wherein the shallow trench isolation material is separated from the back side contact by the dielectric liner and the shallow trench isolation liner, and
wherein the dielectric liner and the back side dielectric fill electrically confine the back side contact in a cross-gate direction in an active region of the semiconductor structure.

2. The semiconductor structure of claim 1, wherein the back side contact contacts a back side of the FET second source-drain region,
wherein the FET first and second source-drain regions extend in a cross-fin direction crossing the shallow trench isolation material,
and wherein the shallow trench isolation liner and the shallow trench isolation material electrically confine the back side contact in the cross-fin direction.

3. The semiconductor structure of claim 2, further comprising a second dielectric material on a back side of the FET first source-drain region.

4. The semiconductor structure of claim 3, wherein the back side power rail is on the back side contact and the second dielectric material, and
wherein the second dielectric material electrically separates the FET first source-drain region from the back side power rail.

5. The semiconductor structure of claim 1, further comprising a back side power distribution network electrically interconnected with the back side power rail.

6. The semiconductor structure of claim 3, further comprising a layer of the second dielectric material on a front side of the shallow trench isolation liner.

7. A semiconductor array structure comprising:
a plurality of p-type field effect transistors (PFETs), each comprising a PFET source, a PFET drain, a PFET gate between the PFET source and the PFET drain, and a PFET channel region defining a first fin under the PFET gate and between the PFET drain and the PFET source;
a plurality of n-type field effect transistors (NFETs), each comprising an NFET source, an NFET drain, an NFET gate between the NFET source and the NFET drain, and an NFET channel region defining a second fin under the NFET gate and between the NFET drain and the NFET source;
a front side wiring network, having a plurality of front side wires, on a front side of the plurality of p-type field effect transistors and the plurality of n-type field effect transistors;
a plurality of first front side conductive paths electrically interconnecting first selected ones of the front side wires with the NFET drains;
a plurality of second front side conductive paths electrically interconnecting second selected ones of the front side wires with the PFET sources;
a plurality of drain back side power rails, disposed by a back side of the p-type field effect transistors;
a plurality of source back side power rails, disposed by a back side of the n-type field effect transistors;
a plurality of drain back side contacts electrically interconnecting the plurality of drain back side power rails with the PFET drains of the p-type field effect transistors;
a plurality of source back side contacts electrically interconnecting the plurality of source back side power rails with the NFET sources of the n-type field effect transistors;
a dielectric liner covering a back side of the PFET gate and a back side of the NFET gate respectively and disposed at a level adjacent to sidewalls of the drain back side contacts and adjacent to sidewalls of the source back side contacts;
a back side dielectric fill on the dielectric liner on the back side of the PFET gate and the back side of the NFET gate respectively and disposed at a level adjacent to the sidewalls of the drain back side contacts and adjacent to sidewalls of the source back side contacts;
a shallow trench isolation liner, wherein a first portion of the shallow trench isolation liner is disposed at a level coplanar to sidewalls of the PFET gate in the PFET channel region and the NFET gate in the NFET channel region, and wherein a second portion of the shallow trench isolation liner separates the dielectric liner from the sidewalls of the source back side contacts and the drain back side contacts; and
a shallow trench isolation material disposed at the level adjacent to the sidewalls of the drain back side contacts and adjacent to sidewalls of the source back side contacts, and defining a plurality of shallow trench isolation regions, wherein the shallow trench isolation material is separated from the source back side contacts and the drain back side contacts by the dielectric liner and the shallow trench isolation liner, and wherein the dielectric liner and the back side dielectric fill electrically confine the drain back side contacts and the source back side contacts in a cross-gate direction in an active region of the semiconductor array structure.

8. The semiconductor array structure of claim 7, wherein the PFET source, the PFET drain, the NFET source and the NFET drain extend in a cross-fin direction, wherein the shallow trench isolation liner and the shallow trench isolation material electrically confining the drain back side contacts and the source back side contacts in the cross-fin direction.

9. The semiconductor structure of claim 8, further comprising a second dielectric material on a back side of the PFET source and the NFET drain.

10. The semiconductor structure of claim 9, wherein the drain back side contacts contact backsides of the PFET drains and the source back side contacts contact backsides of the NFET sources, wherein the drain back side power rails are on the drain back side contacts and disposed at a level adjacent first portions of the second dielectric material, wherein source back side power rails are on the source back side contacts and disposed at a level adjacent second portions of the second dielectric material, and wherein the second dielectric material electrically separates the drain back side power rails from given ones of the PFET sources and also electrically isolates the source back side power rails from given ones of the NFET drains.

11. The semiconductor structure of claim 7, further comprising a back side power distribution network electrically interconnected with the plurality of drain back side power rails and the plurality of source back side power rails.

12. The semiconductor structure of claim 9, further comprising a layer of the second dielectric material on a front side of the shallow trench isolation liner.

13. The semiconductor structure of claim 2, wherein, in the active region, the shallow trench isolation liner is disposed on the sidewall of the back side contact and separates the dielectric liner and the back side dielectric fill from the sidewall of the back side contact.

14. The semiconductor structure of claim 3, wherein the back side contact penetrates the dielectric liner to contact the FET second source-drain region and the second dielectric material penetrates the dielectric liner to contact the FET first source-drain region.

15. The semiconductor structure of claim 8, wherein, in the active region, the shallow trench isolation liner is disposed on the sidewall of the back side contact and separates the dielectric liner and the back side dielectric fill from the sidewall of the back side contact.

16. The semiconductor structure of claim 9, wherein the drain back side contacts penetrate the dielectric liner to contact the PFET drains, wherein the source back side contacts penetrate the dielectric liner to contact the NFET sources.

17. A semiconductor structure comprising:

a field effect transistor (FET) comprising a FET first source-drain region, a FET second source-drain region, a FET gate between the FET first and second source-drain regions, and a FET channel region defining a fin under the FET gate and between the FET first and second source-drain regions;

a front side wiring network, having a plurality of front side wires, on a front side of the field effect transistor (FET);

a front side conductive path electrically interconnecting one of the front side wires with the FET first source-drain region;

a back side power rail, on a back side of the field effect transistor (FET);

a back side contact electrically interconnecting the back side power rail with the FET second source-drain region;

a dielectric liner covering a back side of the FET gate and disposed at a level adjacent to a sidewall of the back side contact;

a back side dielectric fill on the dielectric liner on the back side of the FET gate and disposed at a level adjacent to the sidewall of the back side contact;

a shallow trench isolation liner, wherein a first portion of the shallow trench isolation liner is disposed at a level coplanar to a sidewall of the FET gate in the FET channel region and in an active region of the semiconductor structure and, wherein a second portion of the shallow trench isolation liner separates the dielectric liner from the sidewall of the back side contact, wherein, in the active region, the second portion of the shallow trench isolation liner is disposed on the sidewall of the back side contact and separates the dielectric liner and the back side dielectric fill from the sidewall of the back side contact; and a shallow trench isolation material on the back side of the FET and defining a shallow trench isolation region of the semiconductor structure, wherein the dielectric liner and the back side dielectric fill electrically confine the back side contact in a cross-gate direction in an active region of the semiconductor structure.

18. The semiconductor structure of claim 17, wherein the shallow trench isolation material is separated from the back side contact by the dielectric liner and the shallow trench isolation liner.

* * * * *